United States Patent
Yamada

(10) Patent No.: US 8,373,333 B2
(45) Date of Patent: Feb. 12, 2013

(54) RESONATOR ELEMENT, RESONATOR, ELECTRONIC DEVICE, AND ELECTRONIC APPARATUS

(75) Inventor: Akinori Yamada, Ina (JP)

(73) Assignee: Seiko Epson Corporation (JP)

( * ) Notice: Subject to any disclaimer, the term of this patent is extended or adjusted under 35 U.S.C. 154(b) by 150 days.

(21) Appl. No.: 13/047,102

(22) Filed: Mar. 14, 2011

(65) Prior Publication Data

US 2011/0227452 A1    Sep. 22, 2011

(30) Foreign Application Priority Data

Mar. 16, 2010    (JP) .................................. 2010-059955

(51) Int. Cl.
*H01L 41/08* (2006.01)
(52) U.S. Cl. ........................................ 310/368; 310/370
(58) Field of Classification Search .................. 310/367, 310/368, 370
See application file for complete search history.

(56) References Cited

U.S. PATENT DOCUMENTS

| | | | |
|---|---|---|---|
| 4,771,202 A | 9/1988 | Takahashi | |
| 5,912,524 A * | 6/1999 | Ohnishi et al. ................ | 310/321 |
| 8,156,621 B2 * | 4/2012 | Iwai .............................. | 29/25.35 |
| 8,164,393 B2 * | 4/2012 | Yamada ......................... | 331/156 |
| 2008/0179998 A1 * | 7/2008 | Kawashima ................... | 310/370 |
| 2011/0062832 A1 * | 3/2011 | Kawashima ................... | 310/370 |
| 2011/0068876 A1 * | 3/2011 | Yamada et al. ................ | 331/158 |
| 2011/0215680 A1 * | 9/2011 | Yamada et al. ................ | 310/370 |
| 2011/0227672 A1 * | 9/2011 | Yamada ......................... | 333/200 |

FOREIGN PATENT DOCUMENTS

| | | |
|---|---|---|
| JP | 58-182311 | 10/1983 |
| JP | 04-348606 | 12/1992 |
| WO | WO2010/047115 | 4/2010 |

* cited by examiner

*Primary Examiner* — Mark Budd
(74) *Attorney, Agent, or Firm* — Harness, Dickey & Pierce, P.L.C.

(57) ABSTRACT

A resonator element includes at least one resonating arm that vibrates in a torsional mode, wherein the resonating arm includes a structural portion having a first portion disposed in a first direction in a sectional view in the width direction and a second portion connected to the first portion so that the center of gravity departs from the center of gravity of the first portion in the first direction and a second direction perpendicular to the first direction, wherein the first portion vibrates in a stretch mode in the length direction of the resonating arm with an application of a voltage, and wherein the second portion does not substantially vibrate in the stretch mode in the length direction of the resonating arm with the application of the voltage or vibrates in a stretch mode with a phase different from that of the first portion.

15 Claims, 20 Drawing Sheets

RESONATOR ELEMENT, RESONATOR, ELECTRONIC DEVICE, AND ELECTRONIC APPARATUS

BACKGROUND

1. Technical Field

The present invention relates to a resonator element, a resonator, an electronic device, and an electronic apparatus.

2. Related Art

Electronic devices such as crystal oscillators mounted on electronic apparatuses include a resonator such as a crystal resonator. A resonator having a tuning-fork resonator element including two resonating arms extending to be parallel to each other is known (for example, JP-A-4-348606).

For example, in the crystal resonator described in JP-A-4-348606, two pairs of electrodes are disposed on a pair of surfaces facing each other in the width direction of each resonating arm having a rectangular section in the width direction. Among two pairs of electrodes, by applying voltages with inversed polarities to one pair of electrodes facing each other and the other pair of electrodes facing each other, each resonating arm can be made to vibrate in a torsional mode.

By using this torsional vibration, it is possible to reduce the variation in frequency due to a temperature variation, compared with a resonator using flexing vibration.

However, in the crystal resonator described in JP-A-4-348606, since the section in the width direction of each resonating arm is rectangular as described above, the torsional rigidity of each resonating arm is relatively high and the driving frequency cannot be satisfactorily lowered. When the resonating arm is narrowed to lower the torsional rigidity, the forming area of the electrodes is reduced, thereby not efficiently exciting the torsional vibration.

SUMMARY

An advantage of some aspects of the invention is that it provides a resonator element, a resonator, and an electronic device which can accomplish a decrease in size and frequency and can vibrate in a torsional mode with high efficiency.

Application Example 1

According to this application example of the invention, there is provided a resonator element including at least one resonating arm that vibrates in a torsional mode. Here, the resonating arm includes a structural portion having a first portion disposed in a first direction in a sectional view in the width direction and a second portion connected to the first portion so that the center of gravity departs from the center of gravity of the first portion in the first direction and a second direction perpendicular to the first direction, the first portion vibrates in a stretch mode in the length direction of the resonating arm with an application of a voltage, and the second portion does not substantially vibrate in the stretch mode in the length direction of the resonating arm with the application of the voltage or vibrates in a stretch mode with a phase different from that of the first portion.

According to this configuration, it is possible to excite the torsional vibration using the stretch vibration. Accordingly, it is possible to efficiently excite the torsional vibration. As a result, it is possible to lower a driving voltage of a resonator employing the resonator element.

It is possible to suppress the torsional rigidity of the resonating arm, compared with the case where the sectional shape in the width direction of the resonating arm is rectangular. Accordingly, it is possible to reduce the size of the resonator element and to satisfactorily lower the frequency of the torsional vibration.

As a result, it is possible to provide a resonator element which can accomplish the decrease in size and frequency and vibrate in a torsional mode with a high efficiency.

Application Example 2

In this application example, it is preferred that, in the resonator element, the first portion and the second portion each have a long plate shape in the length direction of the resonating arm and ends thereof in the width direction is connected to each other so that plate surfaces thereof are perpendicular to each other.

Accordingly, with the simple processing such as forming a rectangular groove in the resonating arm having a rectangular section in the width direction, it is possible to form the resonating arm including the first portion and the second portion.

Application Example 3

In this application example, it is preferred that, in the resonator element, the resonating arm includes a plurality of structural portions.

Accordingly, it is possible to relatively simply set conditions for the torsional vibration of the resonating arm, such as frequency and amplitude, to desired ones.

Application Example 4

In this application example, it is preferred that, in the resonator element, the resonating arm includes a plurality of structural portions so as to be arranged in the length direction thereof.

Accordingly, it is possible to relatively simply and efficiently lower the frequency of the torsional vibration of the resonating arm.

Application Example 5

In this application example, it is preferred that, in the resonator element, the resonating arm includes a pair of structural portions so as to face each other with the center axis along the length direction interposed therebetween.

Accordingly, it is possible to prevent or suppress the torsional center axis of the torsional vibration of the resonating arm from departing from the center axis along the length direction of the resonating arm. As a result, it is possible to reduce the vibration leakage in a resonator employing the resonator element.

Application Example 6

In this application example, it is preferred that, in the resonator element, the resonating arm includes the structural portion which is formed to extend all over the range in the length direction.

Accordingly, it is possible to relatively simply and efficiently lower the frequency of the torsional vibration of the resonating arm.

Application Example 7

In this application example, it is preferred that, in the resonator element, the resonating arm is formed to be symmetric about the center axis along the length direction.

Accordingly, it is possible to prevent or suppress the torsional center axis of the torsional vibration of the resonating arm from departing from the center axis along the length direction of the resonating arm. As a result, it is possible to reduce the vibration leakage in a resonator employing the resonator element.

Application Example 8

In this application example, it is preferred that, in the resonator element, the distal end of the resonating arm is provided with a massive portion of which the sectional area in the sectional view along the width direction of the resonating arm is greater than that of the structural portion.

Accordingly, it is possible to reduce the size of the resonator element or to lower the frequency of the torsional vibration of the resonating arm.

Application Example 9

In this application example, it is preferred that, the resonator element includes a plurality of resonating arms.

Accordingly, it is possible to more efficiently excite the torsional vibration of the resonating arm.

Application Example 10

In this application example, it is preferred that, in the resonator element, a pair of the resonating arms vibrating in a torsional mode in the same direction are provided to be parallel to each other.

Accordingly, it is possible to prevent or suppress the unintentional vibration (vibration in the thickness direction) of a portion connecting the base ends of the pair of resonating arms. As a result, it is possible to prevent or suppress vibration leakage from the resonator element.

Application Example 11

In this application example, it is preferred that, in the resonator element, the resonating arm is formed of a piezoelectric material.

Accordingly, with a relatively simple structure in which electrodes are formed on the surface of the resonating arm, it is possible to cause the resonating arm to vibrate in a torsional mode. As a result, it is possible to accomplish the decrease in size and cost of the resonator element.

Application Example 12

In this application example, it is preferred that, in the resonator element, the resonating arm is formed of a non-piezoelectric material and a piezoelectric element having a piezoelectric thin film is disposed on the first portion of the resonating arm.

For example, when silicon is used as the non-piezoelectric material, it is possible to form the resonating arm with high size precision by etching. Accordingly, it is possible to relatively simply obtain a resonator element having a desired vibration characteristic.

Application Example 13

According to this application example of the invention, there is provided a resonator including: the above-mentioned resonator element; and a package that receives the resonator element therein.

Accordingly, it is possible to provide a resonator which can accomplish a decrease in size and frequency and vibrate in a torsional mode with high efficiency.

Application Example 14

According to this application example of the invention, there is provided an electronic device including: the above-mentioned resonator element; and an electronic component that drives the resonator element.

Accordingly, it is possible to provide an electronic device which can accomplish the decrease in size and frequency and vibrate in a torsional mode with high efficiency.

Application Example 15

According to this application example of the invention, there is provided an electronic apparatus including: the above-mentioned resonator element; and an electronic component that drives the resonator element.

Accordingly, it is possible to provide an electronic apparatus which can accomplish the decrease in size and frequency and vibrate in a torsional mode with high efficiency.

BRIEF DESCRIPTION OF THE DRAWINGS

The invention will be described with reference to the accompanying drawings, wherein like numbers reference like elements.

FIG. 5A is a sectional view taken along line A-A of FIG. 1 and FIG. 5B is a sectional view taken along line B-B of FIG. 1.

DESCRIPTION OF EXEMPLARY EMBODIMENTS

Hereinafter, a resonator element, a resonator, an electronic device, and an electronic apparatus according to exemplary embodiments of the invention will be described in detail with reference to the accompanying drawings.

First Embodiment

Figure 1:
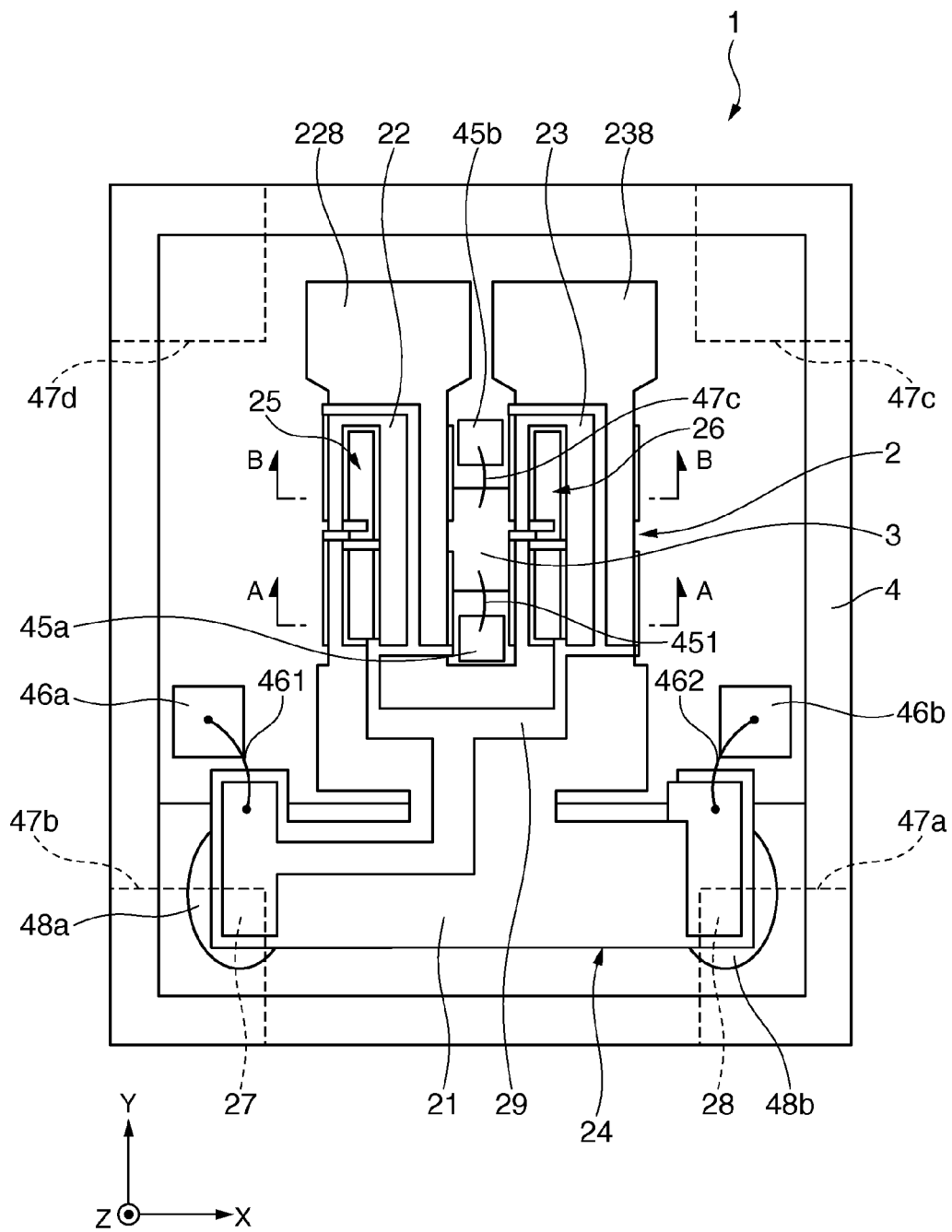
FIG. 1 is a top view of an electronic device according to a first embodiment of the invention.
Figure 2:
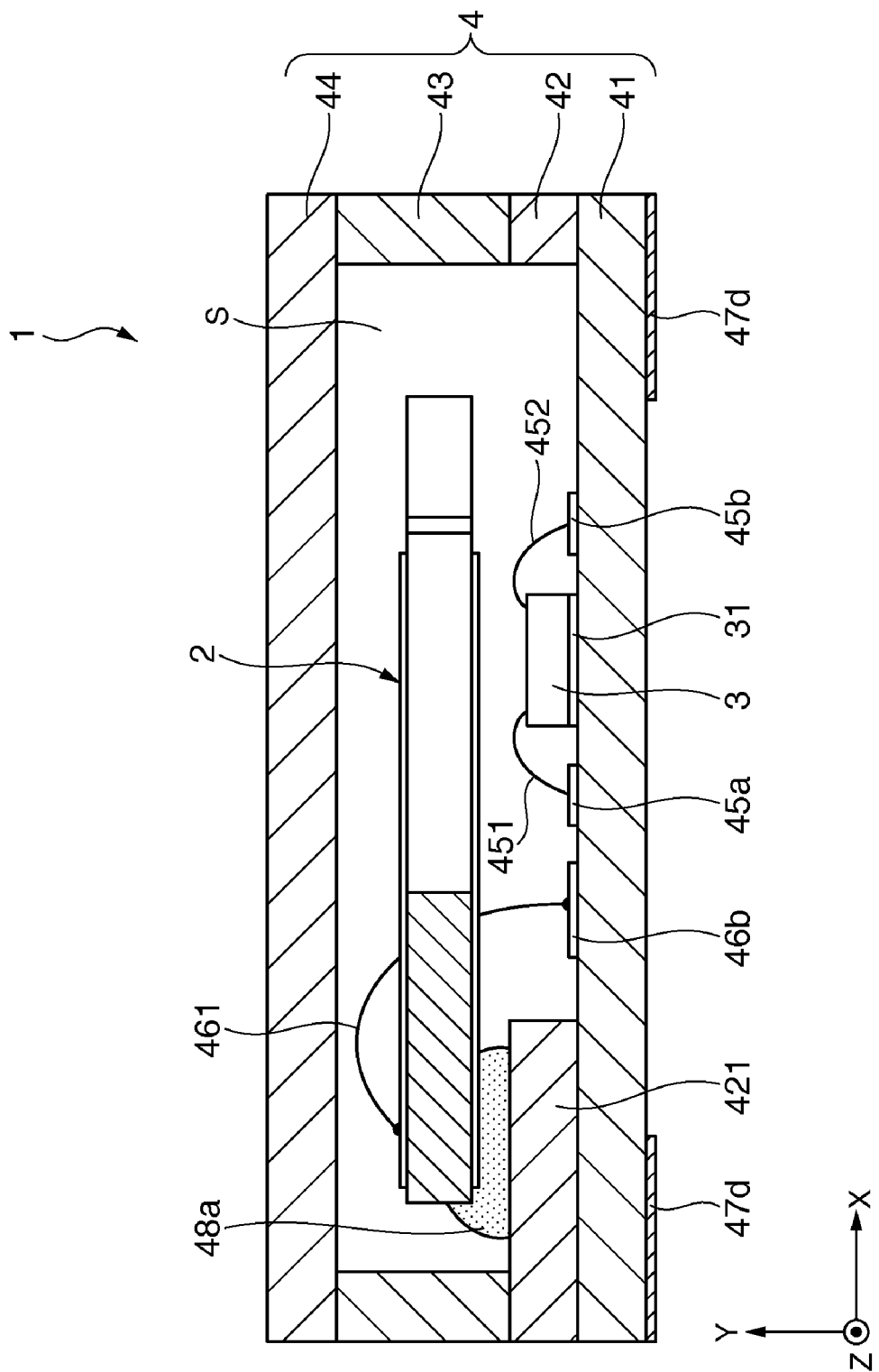
FIG. 2 is a sectional view of the electronic device shown in FIG. 1.
Figure 3:
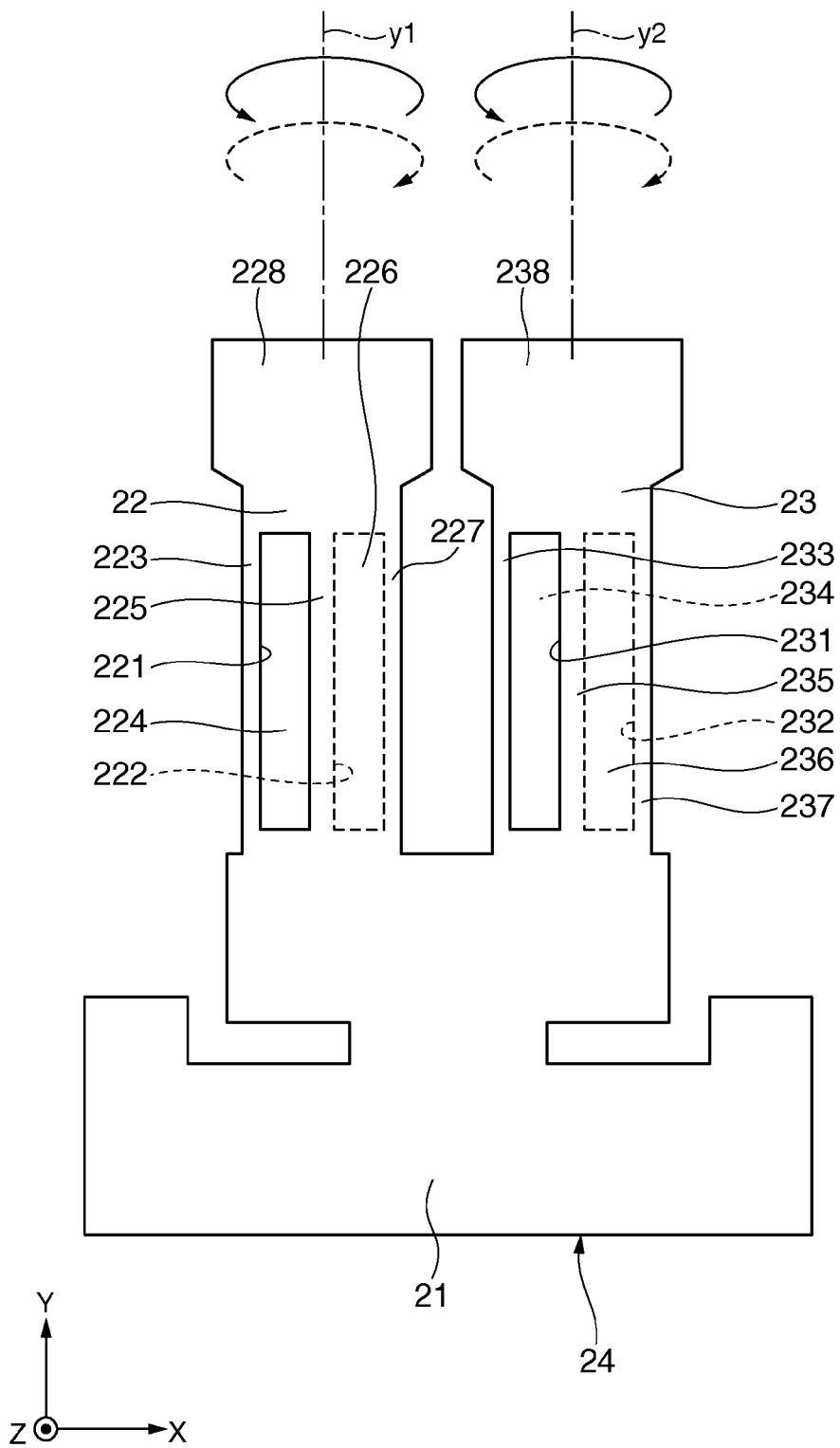
FIG. 3 is a top view of a resonator element included in the electronic device shown in FIG. 1 (where electrodes are not shown).
Figure 4:
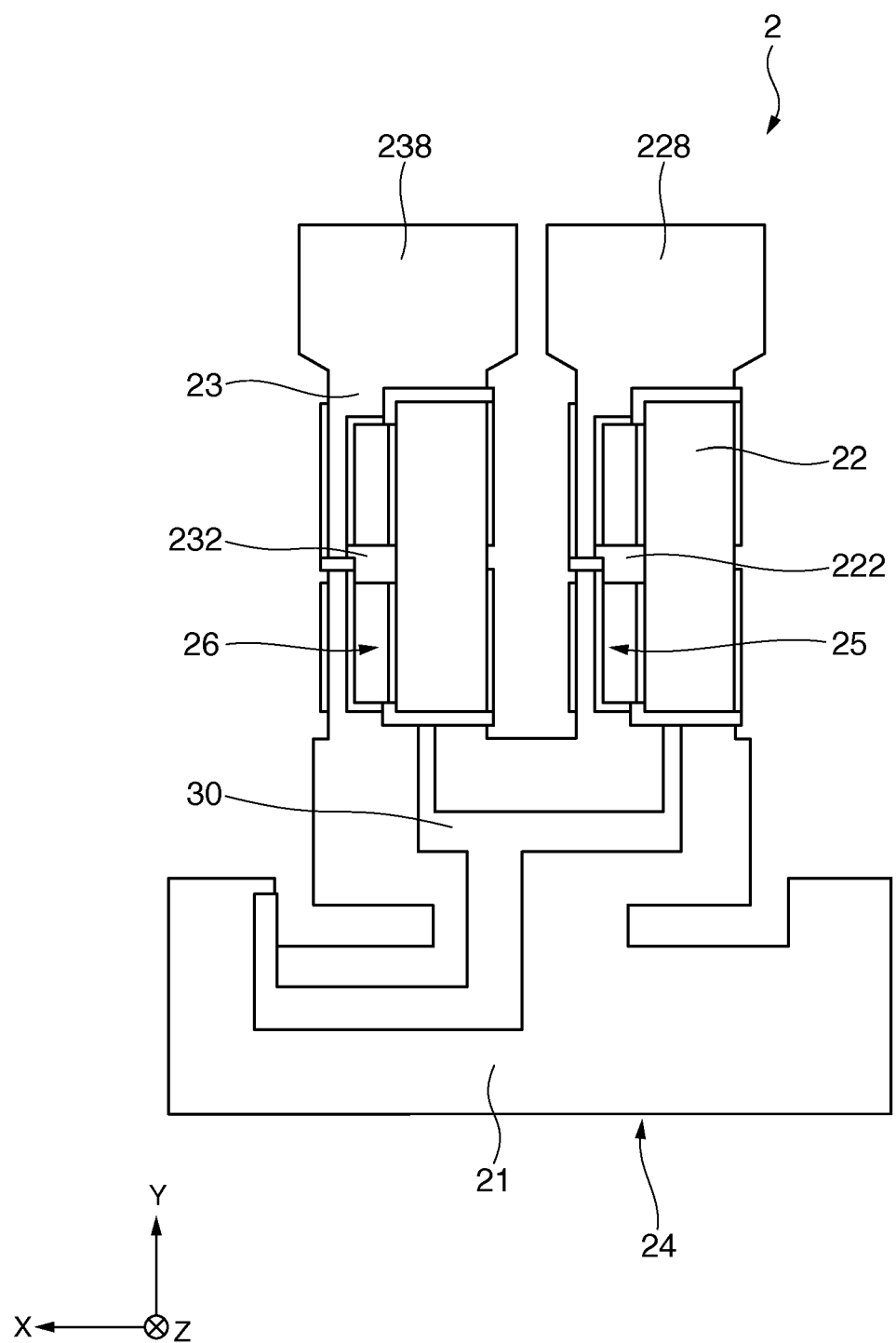
FIG. 4 is a bottom view of the resonator element included in the electronic device shown in FIG. 1.
Figure 5A:
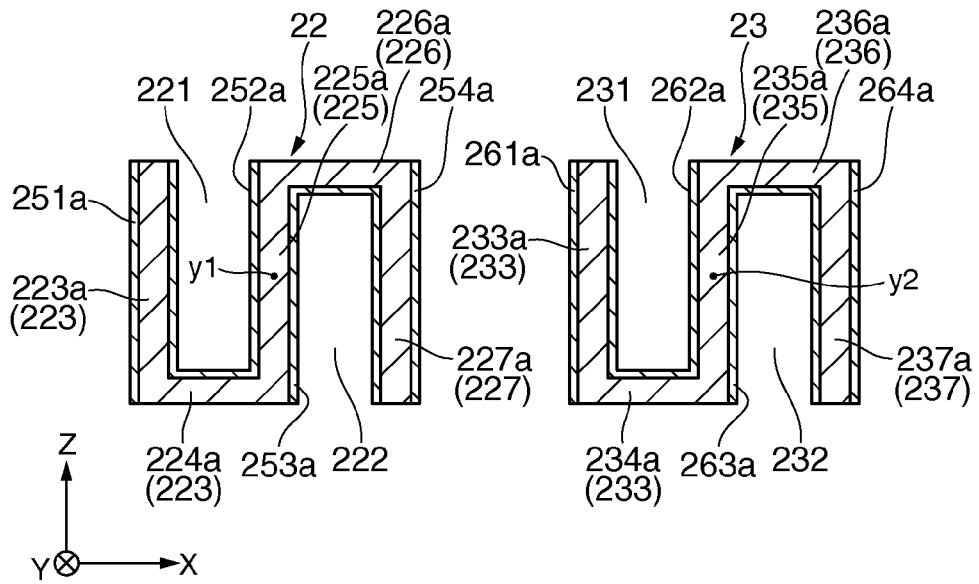
FIGS. 5A and 5B are sectional views of the resonator element included in the electronic device shown in FIG. 1, where
Figure 5B:
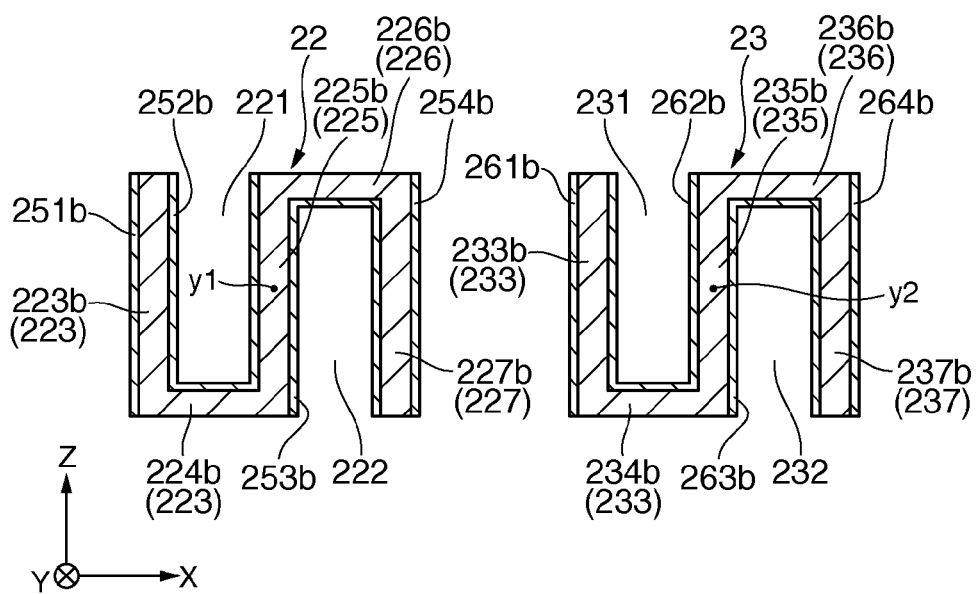
Figure 6:
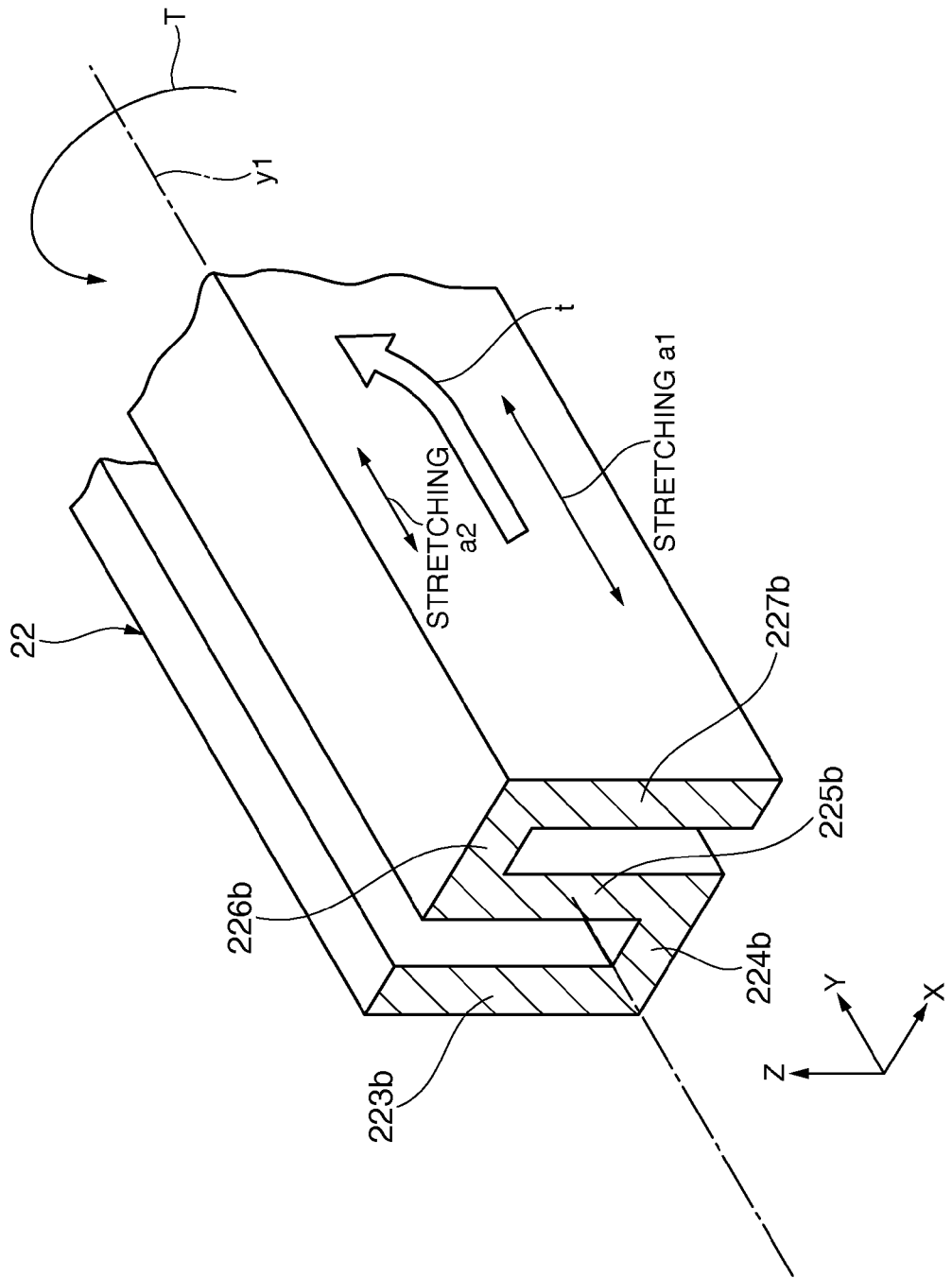
FIG. 6 is a partially-enlarged perspective view illustrating the behavior of a resonating arm of the resonator element shown in FIGS. 5A and 5B.

FIG. 1 is a top view of an electronic device according to a first embodiment of the invention. FIG. 2 is a sectional view of the electronic device shown in FIG. 1. FIG. 3 is a top view of a resonator element included in the electronic device shown in FIG. 1 (where electrodes are not shown). FIG. 4 is a bottom view of the resonator element included in the electronic device shown in FIG. 1. FIGS. 5A and 5B are sectional views of the resonator element included in the electronic device shown in FIG. 1, where FIG. 5A is a sectional view taken along line A-A of FIG. 1 and FIG. 5B is a sectional view taken along line B-B of FIG. 1. FIG. 6 is a partially-enlarged perspective view illustrating the behavior of a resonating arm of the resonator element shown in FIGS. 5A and 5B. In the drawings, an X axis, a Y axis, and a Z axis are shown as three axes perpendicular to each other. In the following description, the direction parallel to the X axis is defined as an "X axis direction", the direction (first direction) parallel to the Y axis is defined as a "Y axis direction", and the direction (second direction) parallel to the Z axis is defined as a "Z axis direction". For the purpose of convenient explanation, the upside in FIG. 2 is described as "upper", the downside is described as "lower", the right side is described as "right", and the left side is described as "left".

The electronic device 1 shown in FIG. 1 includes a resonator element 2, an electronic component 3 driving the resonator element 2, and a package 4 receiving the resonator element 2 and the electronic component 3 therein. Here, the resonator element 2 and the package 4 constitute a resonator.

Hereinafter, constituent elements of the electronic device 1 will be sequentially described in detail.

Vibrator Element

The resonator element 2 will be first described.

In this embodiment, the resonator element 2 is a tuning-fork piezoelectric resonator element as shown in FIG. 1. The resonator element 2 includes a base portion 21, a piezoelectric member 24 having a pair of resonating arms 22 and 23, and excitation electrode groups 25 and 26 and connection electrodes 27 and 28 disposed on the piezoelectric member 24.

The piezoelectric member 24 is formed of a piezoelectric material. Examples of the piezoelectric material include quartz crystal, lithium tantalate, lithium niobate, lithium borate, and barium titanate. Particularly, quartz crystal can be preferably used as the piezoelectric material. By forming the piezoelectric member 24 (resonating arms 22 and 23) out of the piezoelectric material, it is possible to cause the resonating arms 22 and 23 to vibrate in a torsional mode with a relatively simple structure in which electrodes (excitation electrode groups 25 and 26 and the like) are formed on the surfaces of the resonating arms 22 and 23. Accordingly, it is possible to accomplish a decrease in size and cost of the resonator element 2.

In the piezoelectric member 24, the pair of resonating arms 22 and 23 extends from the base portion 21 so as to be parallel to each other. Accordingly, the piezoelectric member 24 has a tuning-fork shape. In this embodiment, the pair of resonating arms 22 and 23 is arranged in the X axis direction and extends in the Y axis direction from the base portion 21. The base portion 21 is not limited to the shape shown, but may have any shape.

The resonating arms 22 and 23 each have a rectangular shape. An end (base end) close to the base portion 21 is a fixed end and the opposite end (distal end) of the base portion 21 is a free end.

As shown in FIG. 3, the resonating arm 22 is provided with two grooves 221 and 222, a sectional shape of which in the width direction (a section perpendicular to the extending direction) is rectangular, in the extending direction (length direction) thereof. The groove 221 is eccentrically located to one side (the left side in FIG. 3) in the width direction of the top surface of the resonating arm 22. The groove 222 is eccentrically located to the opposite side (the right side in FIG. 3) of the groove 221 in the width direction of the bottom surface of the resonating arm 22. The groove 221 and the groove 222 are disposed so as not to overlap with each other in a plan view (as viewed in the Z axis direction). In this way, the section in the width direction of the resonating arm 22 has substantially an S shape (see FIGS. 5A and 5B).

In other words, the resonating arm 22 includes three portions (the first portion) 223, 225, and 227 parallel to each other in the Z axis direction, a portion (the second portion) 224 connecting the lower ends (ends in the Z axis direction) of the portion 223 and the portion 225 in the X axis direction, and a portion 226 connecting the upper ends (the opposite ends in the Z axis direction) of the portion 225 and the portion 227 in the X axis direction, in the sectional view in the width direction (XZ plane).

Similarly, the resonating arm 23 is provided with two grooves 231 and 232, a sectional shape of which in the width direction is rectangular, in the extending direction (length direction) thereof. The groove 231 is eccentrically located to one side (the left side in FIG. 3) in the width direction of the top surface of the resonating arm 23. The groove 232 is eccentrically located to the opposite side (the right side in FIG. 3) of the groove 231 in the width direction of the bottom surface of the resonating arm 23. The groove 231 and the groove 232 are disposed so as not to overlap with each other in a plan view (as viewed in the Z axis direction). In this way, the section in the width direction of the resonating arm 23 has substantially an S shape (see FIGS. 5A and 5B).

In other words, the resonating arm 23 includes three portions (the first portion) 233, 235, and 237 parallel to each other in the Z axis direction, a portion (the second portion)

234 connecting the lower ends (ends in the Z axis direction) of the portion 233 and the portion 235 in the X axis direction, and a portion 236 connecting the upper ends (the opposite ends in the Z axis direction) of the portion 235 and the portion 237 in the X axis direction, in the sectional view in the width direction (XZ plane).

The distal end of the resonating arm 22 is provided with a massive portion (hammer head) 228 having a larger sectional area in the width direction than that of the portion (structural portion) in which the grooves 221 and 222 are formed. Similarly, the distal end of the resonating arm 23 is provided with a massive portion (hammer head) 238 having a larger section area in the width direction than that of the portion (structural portion) in which the grooves 231 and 232 are formed. Accordingly, it is possible to reduce the size of the vibration reed 2 or to lower the frequency of the torsional vibration of the resonating arms 22 and 23. The massive portions 228 and 238 may be provided or not provided as needed.

An excitation electrode group 25 used to apply a voltage (an electric field) to the resonating arm 22 is formed on the resonating arm 22, and an excitation electrode group 26 used to apply a voltage (an electric field) to the resonating arm 23 is formed on the resonating arm 23.

The excitation electrode group 25 includes excitation electrodes 251a and 251b formed on side surfaces of one side (close to the groove 221) in the width direction of the resonating arm 22, vibration electrodes 252a and 252b formed on the walls of the groove 221, excitation electrodes 253a and 253b formed on the walls of the groove 222, and excitation electrodes 254a and 254b formed on side surfaces on the other side (close to the groove 222) in the width direction of the resonating arm 22.

The excitation electrodes 251a, 252a, 253a, and 254a are disposed to correspond to the distal end portions of the grooves 221 and 222 of the resonating arm 22. The excitation electrodes 251b, 252b, 253b, and 254b are disposed to correspond to the base end portions of the grooves 221 and 222 of the resonating arm 22.

Similarly, the excitation electrode group 26 includes excitation electrodes 261a and 261b formed on side surfaces of one side (close to the groove 231) in the width direction of the resonating arm 23, vibration electrodes 262a and 262b formed on the walls of the groove 231, excitation electrodes 263a and 263b formed on the walls of the groove 232, and excitation electrodes 264a and 264b formed on side surfaces on the other side (close to the groove 232) in the width direction of the resonating arm 23.

The excitation electrodes 261a, 262a, 263a, and 264a are disposed to correspond to the distal end portions of the grooves 231 and 232 of the resonating arm 23. The excitation electrodes 261b, 262b, 263b, and 264b are disposed to correspond to the base end portions of the grooves 231 and 232 of the resonating arm 23.

The excitation electrodes 251a, 252b, 253a, 254b, 261a, 262b, 263a, and 264b are electrically connected to a connection electrode 27 via an interconnection 29. The excitation electrodes 251b, 252a, 253b, 254a, 261b, 262a, 263b, and 264a are electrically connected to a connection electrode 28 via an interconnection 30.

Accordingly, when a voltage is applied between the connection electrode 27 and the connection electrode 28, a voltage in the X axis direction is applied to the portions 223, 225, and 227 of the resonating arm 22 and the portions 233, 235, and 237 of the resonating arm 23 so that the excitation electrodes 251a, 252b, 253a, 254b, 261a, 262b, 263a, and 264b and the excitation electrodes 251b, 252a, 253b, 254a, 261b, 262a, 263b, and 264a are in inverse phases. Due to the inverse piezoelectric effect of a piezoelectric material, the resonating arms 22 and 23 can be made to vibrate in a torsional mode at a constant frequency (resonance frequency). When the resonating arms 22 and 23 vibrate in a torsional mode, a voltage at a constant frequency is generated between the connection electrodes 27 and 28 due to the piezoelectric effect of the piezoelectric material. The resonator element 2 can generate an electrical signal vibrating at the resonance frequency using this characteristic.

The excitation electrode groups 25 and 27, the connection electrodes 27 and 28, and the interconnections 29 and 30 can be formed of a metal material having excellent conductivity such as aluminum, aluminum alloy, silver, silver alloy, chromium, chromium alloy, and gold.

Physical film-forming methods such as sputtering method and vacuum vapor deposition method, chemical vapor deposition methods such as a CVD, and application methods such as an ink jet method can be used as the method of forming the electrodes.

Here, the behaviors (principles of the torsional vibration) of the resonating arms 22 and 23 will be described in detail.

In this embodiment, as shown in FIG. 3, the resonating arm 22 vibrates in a torsional mode about an axis line y1 along the extending direction (length direction) thereof. The resonating arm 23 vibrates in a torsional mode in the same direction (in phase) as the resonating arm 22 about an axis line y2 along the extending direction (length direction) thereof.

The behavior of the resonating arm 22 will be described below. The behavior of the resonating arm 23 is the same as the resonating arm 22 and thus will not be described.

As shown in FIG. 5A, the excitation electrode 251a is disposed on the side surface on one side (close to the groove 221) in the width direction of the distal end portion of the resonating arm 22 as described above, the excitation electrode 252a is disposed on the wall of the distal end portion of the groove 221, the excitation electrode 253a is disposed on the wall of the distal end portion of the groove 222, and the excitation electrode 254a is disposed on the side surface on the other side (close to the groove 222) in the width direction of the distal end portion of the resonating arm 22.

Accordingly, when a voltage is applied between the excitation electrode 251a and the excitation electrode 252a, an electric field in the X axis direction is generated in the distal end portion 223a of the portion 223 of the resonating arm 22. By this electric field, the distal end portion 223a stretches or contracts in the Y axis direction.

When a voltage is applied between the excitation electrode 252a and the excitation electrode 253a, an electric field in the X axis direction is generated in the distal end portion 226a of the portion 226 of the resonating arm 22. By this electric field, the distal end portion 226a stretches or contracts in the Y axis direction. The stretching or contracting of the distal end portion 226a is caused differently (in the inverse phase) from the distal end portion 223a.

When a voltage is applied between the excitation electrode 253a and the excitation electrode 254a, an electric field in the X axis direction is generated in the distal end portion 227a of the portion 227 of the resonating arm 22. By this electric field, the distal end portion 227a stretches or contracts in the Y axis direction. The stretching or contracting of the distal end portion 227a is caused in the same phase (in phase) as the distal end portion 223a.

On the other hand, even when the voltage is applied as described above, the distal end portion 224a of the portion 224 of the resonating arm 22 and the distal end portion 226a of the portion 226 do not substantially stretch or contract in the Y axis direction.

As shown in FIG. 5B, the excitation electrode 251b is disposed on the side surface on one side (close to the groove 221) in the width direction of the base end portion of the resonating arm 22 as described above, the excitation electrode 252b is disposed on the wall of the base end portion of the groove 221, the excitation electrode 253b is disposed on the wall of the base end portion of the groove 222, and the excitation electrode 254b is disposed on the side surface on the other side (close to the groove 222) in the width direction of the base end portion of the resonating arm 22.

Accordingly, when a voltage is applied between the excitation electrode 251b and the excitation electrode 252b, an electric field in the X axis direction is generated in the base end portion 223b of the portion 223 of the resonating arm 22. By this electric field, the base end portion 223b stretches or contracts in the Y axis direction. The stretching or contracting of the base end portion 223b is caused differently (in the inverse phase) from the distal end portion 223a.

When a voltage is applied between the excitation electrode 252b and the excitation electrode 253b, an electric field in the X axis direction is generated in the base end portion 226b of the portion 226 of the resonating arm 22. By this electric field, the base end portion 226b stretches or contracts in the Y axis direction. The stretching or contracting of the base end portion 226b is caused differently (in the inverse phase) from the distal end portion 225a and the base end portion 223b.

When a voltage is applied between the excitation electrode 253b and the excitation electrode 254b, an electric field in the X axis direction is generated in the base end portion 227b of the portion 227 of the resonating arm 22. By this electric field, the base end portion 227b stretches or contracts in the Y axis direction. The stretching or contracting of the base end portion 227b is caused in the same (in phase) as the distal end portion 223b and in the phase (in the inverse phase) different from the distal end portion 227a.

On the other hand, even when the voltage is applied as described above, the base end portion 224b of the portion 224 of the resonating arm 22 and the base end portion 226b of the portion 226 do not substantially stretch or contract in the Y axis direction.

When the distal end portions are viewed in the section along the width direction, the resonating arm 22 has a first structural portion (structural portion) including the distal end portion 223a (the first portion) disposed in the Z axis direction (the first direction) and the distal end portion 224a (the second portion) connected to the distal end portion 223a so that the center of gravity departs from the center of gravity of the distal end portion 223a in the Z axis direction and the X axis direction (the second direction) perpendicular thereto.

When the distal end portions are viewed in the section along the width direction, the resonating arm 22 has a second structural portion (structural portion) including the distal end portion 225a (the first portion) disposed in the Z axis direction (the first direction) and the distal end portion 224a (the second portion) connected to the distal end portion 225a so that the center of gravity departs from the center of gravity of the distal end portion 225a in the Z axis direction and the X axis direction (the second direction) perpendicular thereto.

When the distal end portions are viewed in the section along the width direction, the resonating arm 22 has a third structural portion (structural portion) including the distal end portion 225a (the first portion) disposed in the Z axis direction (the first direction) and the distal end portion 226a (the second portion) connected to the distal end portion 225a so that the center of gravity departs from the center of gravity of the distal end portion 225a in the Z axis direction and the X axis direction (the second direction) perpendicular thereto.

When the distal end portions are viewed in the section along the width direction, the resonating arm 22 has a fourth structural portion (structural portion) including the distal end portion 227a (the first portion) disposed in the Z axis direction (the first direction) and the distal end portion 226a (the second portion) connected to the distal end portion 227a so that the center of gravity departs from the center of gravity of the distal end portion 227a in the Z axis direction and the X axis direction (the second direction) perpendicular thereto.

When the base end portions are viewed in the section along the width direction, the resonating arm 22 has a fifth structural portion (structural portion) including the base end portion 223b (the first portion) disposed in the Z axis direction (the first direction) and the base end portion 224b (the second portion) connected to the base end portion 223b so that the center of gravity departs from the center of gravity of the base end portion 223b in the Z axis direction and the X axis direction (the second direction) perpendicular thereto.

When the base end portions are viewed in the section along the width direction, the resonating arm 22 has a sixth structural portion (structural portion) including the base end portion 225b (the first portion) disposed in the Z axis direction (the first direction) and the base end portion 224b (the second portion) connected to the base end portion 225b so that the center of gravity departs from the center of gravity of the base end portion 225b in the Z axis direction and the X axis direction (the second direction) perpendicular thereto.

When the base end portions are viewed in the section along the width direction, the resonating arm 22 has a seventh structural portion (structural portion) including the base end portion 225b (the first portion) disposed in the Z axis direction (the first direction) and the base end portion 226b (the second portion) connected to the base end portion 225b so that the center of gravity departs from the center of gravity of the base end portion 225b in the Z axis direction and the X axis direction (the second direction) perpendicular thereto.

When the base end portions are viewed in the section along the width direction, the resonating arm 22 has an eighth structural portion (structural portion) including the base end portion 227b (the first portion) disposed in the Z axis direction (the first direction) and the base end portion 226b (the second portion) connected to the base end portion 227b so that the center of gravity departs from the center of gravity of the base end portion 227b in the Z axis direction and the X axis direction (the second direction) perpendicular thereto.

Here, the operation (the operation of the eighth structural portion) between the base end portion 226b (the second portion) and the base end portion 227b (the first portion) will be representatively described with reference to FIG. 6.

As described above, the base end portion 227b (the first portion) vibrates in a stretch mode in the length direction (the Y axis direction) of the resonating arm 22 with the application of a voltage (for example, an AC voltage).

The base end portion 226b (the second portion) does not substantially vibrate in a stretch mode in the length direction of the resonating arm 22 with the application of the voltage.

Accordingly, as shown in FIG. 6, when the base end portion 227b is about to stretch in the Y axis direction, the stretching is partially regulated (hindered) by the base end portion 226b substantially not stretching. Therefore, the stretch amount a1 of the base end portion 227b on the opposite side of the base end portion 226b is greater than the stretch amount a2 of the base end portion 227b on the side of the base end portion 226b. As a result, a force t for flexing the base end portion 227 in the Z axis direction is generated.

The force t acts on one end (that is, a portion departing from the center of gravity) in the width direction (the X axis direction) of the base end portion 226b. Therefore, the base end portion 226b to which the force is applied is not simply flexed in the Z axis direction but is deformed in a torsional mode.

In the base end portions of the resonating arm 22, since the rigidity of the portion (the base end portion) fixed to the base portion 21 is higher than that of the distal end portion, the distal end portion is deformed in a torsional mode to generate a rotational torque T.

In this way, the base end portion 226b converts the stretch vibration in the Y axis direction of the base end portion 227b into the torsional vibration. Accordingly, the eighth structural portion vibrates in the torsional mode by cooperation of the base end portion 226b and the base end portion 227b.

The base end portion 227b and the base end portion 226b have a long plate shape along the length direction of the resonating arm 22 and the ends thereof are connected to each other in the width direction thereof so that the plate surfaces thereof are perpendicular to each other. Therefore, with a simple process of forming a rectangular groove in the resonating arm having a rectangular section in the width direction or the like, it is possible to form the resonating arm 22 having the base end portion 227b and the base end portion 226b.

Similarly to the base end portion 226b and the base end portion 227b (the eighth structural portion), the base end portion 223b and the base end portion 224b (the fifth structural portion), the base end portion 225b and the base end portion 224b (the sixth structural portion), and the base end portion 225b and the base end portion 226b (the seventh structural portion) generate the rotational torque T.

The distal end portion 226a and the distal end portion 227a (the first structural portion), the distal end portion 223a and the distal end portion 224a (the second structural portion), the distal end portion 225a and the distal end portion 224a (the third structural portion), and the distal end portion 225a and the distal end portion 226a (the fourth structural portion) are deformed in the torsional mode to generate the rotational torque T, similarly to the base end portion 226b and the base end portion 227b.

In this way, the structural portions vibrate in the torsional mode by cooperation of the first portion and the second portion and thus the resonating arm 22 vibrates in the torsional mode.

According to this configuration of the resonator element 2, it is possible to excite the torsional vibration using the stretch vibration. Accordingly, it is possible to efficiently excite the torsional vibration. As a result, it is possible to accomplish the decrease in driving voltage of a resonator employing the resonator element 2.

Compared with the case where the sectional shape in the width direction of the resonating arm is rectangular, it is possible to suppress the torsional rigidity of the resonating arms 22 and 23. Therefore, it is possible to accomplish the decrease in size of the resonator element 2 and to satisfactorily lower the frequency of the torsional vibration.

The resonating arm 22 includes plural structural portions (the first to eighth structural portions). Accordingly, the conditions such as the frequency and the amplitude of the torsional vibration of the resonating arm 22 can be set to desired ones relatively simply.

The resonating arm 22 includes plural structural portions (the first to fourth structural portions and the fifth to eighth structural portions) arranged in the length direction thereof. Accordingly, it is possible to lower the frequency of the torsional vibration of the resonating arm 22 relatively simply and efficiently.

In the resonating arm 22, the pairs of structural portions (the first structural portion and the fourth structural portion, the second structural portion and the third structural portion, the fifth structural portion and the eighth structural portion, and the sixth structural portion and the seventh structural portion) are arranged to face each other with the center axis (the axis line y1) along the length direction. Accordingly, it is possible to prevent or suppress the torsional center axis of the torsional vibration of the resonating arm 22 from departing from the center axis (the axis line y1) along the length direction of the resonating arm 22. Therefore, it is possible to reduce the vibration leakage in the resonator employing the resonator element 2.

The resonating arm 22 is formed to be symmetric about the center axis (the axis line y1) along the length direction. Accordingly, it is possible to prevent or suppress the torsional center axis of the torsional vibration of the resonating arm 22 from departing from the center axis (the axis line y1) along the length direction of the resonating arm 22. Therefore, it is possible to reduce the vibration leakage in the resonator employing the resonator element 2.

The advantages of the resonating arm 22 are true of the resonating arm 23 having the same configuration as the resonating arm 22.

In the resonator element 2 having the resonating arms 22 and 23, it is possible to more efficiently excite the torsional vibration of the resonating arms 22 and 23.

Particularly, since the resonating arms 22 and 23 are disposed to be parallel to each other and vibrate in the torsional mode in the same direction, it is possible to prevent or suppress the portion connecting the base ends of the resonating arms 22 and 23 from unintentionally vibrating (vibrating in the thickness direction). Therefore, it is possible to prevent or suppress the vibration leakage from the resonator element 2.

Package

The package 4 receiving and fixing the resonator element 2 will be described below.

The package 4 has substantially a rectangular shape in the plan view. As shown in FIG. 2, the package 4 includes a plate-like base substrate 41, frame-like frame members 42 and 43, and a plate-like lid member 44. The base substrate 41, the frame member 42, the frame member 43, and the lid member 44 are sequentially stacked from the lower side to the upper side. The base substrate 41 and the frame member 42, the frame member 42 and the frame member 43, and the frame member 43 and the lid member 44 are bonded to each other, respectively, with an adhesive or a soldering material. The package 4 receives the resonator element 2 and the electronic component 3 in an inner space S defined by the base substrate 41, the frame member 42, the frame member 43, and the lid member 44. The lid member 44 is not shown in FIG. 1.

The base substrate 41 is preferably formed of an insulating (non-conductive) material. Examples thereof include a variety of glass materials, a variety of ceramic materials such as oxide ceramics, nitride ceramics, and carbide ceramics, and a variety of resin material such as polyimide.

Examples of the constituent material of the frame members 42 and 43 and the lid member 44 include the same materials as the base substrate 41, a variety of metal materials such as Al and Cu, and a variety of glass materials. Particularly, when a light-transmitting material such as a glass material is used as the constituent material of the lid member 44 and a metal coating portion (not shown) is formed in advance in the resonator element 2, a laser beam can be easily applied to the metal coating portion through the lid member 44 to remove the metal coating portion and to reduce the mass of the resonator element 2 (by a mass reducing method) even after the resonator element 2 is received in the package 4, it is possible to adjust the frequency of the resonator element 2.

As shown in FIGS. 1 and 2, the frame member 42 includes an extension portion 421 formed by causing a part (the left portion in FIG. 2) to extend so as to face the inner space S.

Adhesives 48a and 48b such as epoxies and polyimides are applied on the top surface of the extension portion 421 and the resonator element 2 is placed on the adhesives 48a and 48b. By curing the adhesives 48a and 48b, the resonator element 2 is satisfactorily fixed to the extension portion 421.

A pair of electrodes 46a and 46b may be formed on the top surface of the extension portion 421 and the resonator element 2 may be fixed thereto using a conductive adhesive such as epoxies and polyimides containing conductive particles as the adhesives 48a and 48b. In this case, by fixing the resonator element 2 with the top and button inverted, the connection electrodes 27 and 28 can be electrically connected to the pair of electrodes 46a and 46b with the adhesives 48a and 48b.

As shown in FIGS. 1 and 2, the electronic component 3 is bonded to the top surface of the base substrate 41 with an adhesive member 31 such as an insulating (non-conductive) adhesive or adhesive sheet.

A pair of electrodes 45a and 45b is formed on the top surface of the base substrate 41. The pair of electrodes 45a and 45b is electrically connected to an electrode portion (not shown) of the electronic component 3 via metal wires (bonding wires) 451 and 452 formed, for example, by a wire bonding method.

Without using the adhesive member 31 and the metal wires 451 and 452, the electronic component 3 may be fixed to the base substrate 41 to electrically connect the electronic component 3 to the pair of electrodes 45a and 45b by a so-called face-down bonding method.

A pair of electrodes 46a and 46b is formed on the top surface of the base substrate 41, the electrode 46a is electrically connected to the connection electrode 27 of the resonator element 2 via a metal wire 461 formed in the same was as described above, and the electrode 46b is electrically connected to the connection electrode 28 of the resonator element 2 via a metal wire 462 formed in the same way as described above.

The pair of electrodes 46a and 46b is electrically connected to the pair of electrodes 45a and 45b via interconnections not shown.

On the other hand, as shown in FIG. 2, four external terminals 47a, 47b, 47c, and 47d are formed at four corners on the bottom surface of the base substrate 41.

Among the four external terminals 47a to 47d, the external terminals 47a and 47b are hot terminals electrically connected to the pair of electrodes 45a and 45b via conductor posts disposed in via-holes formed through the base substrate 41, respectively. The other two external terminals 47c and 47d are dummy terminals used to enhance the bonding strength or to uniformize the distance between the package 4 and a mounting board when the package 4 is mounted on the mounting board.

The electrodes 45a, 45b, 46a, and 46b and the external terminals 47a to 47d can be formed, for example, by plating a tungsten or nickel-plated underlying layer with god.

A writing terminal used to inspect the characteristics of the electronic component 3 or re-write (adjust) a variety of information (for example, temperature-compensating information of the electronic device) of the electronic component 3 may be formed on the bottom surface of the base substrate 41 as needed.

Electronic Component

The electronic component 3 is, for example, an integrated circuit (IC) device, is electrically connected to the resonator element 2, and has a function of driving the resonator element 2. By forming an oscillation circuit in the electronic component 3, an electronic device 1 may be constructed as a piezoelectric oscillator. By forming an angular velocity detection circuit in the electronic component 3, the electronic device 1 may be constructed as a piezoelectric gyro sensor.

According to the above-mentioned first embodiment of the invention, it is possible to excite the torsional vibration using the stretch vibration. Therefore, it is possible to efficiently excite the torsional vibration. As a result, it is possible to accomplish the decrease in driving voltage of a resonator employing the resonator element 2.

Compared with the case where the sectional shape in the width direction of the resonating arm is rectangular, it is possible to reduce the torsional rigidity of the resonating arms 22 and 23. Therefore, it is possible to accomplish the decrease in size of the resonator element 2 and to satisfactorily lower the frequency of the torsional vibration.

From the above-mentioned points of view, it is possible to provide a resonator element 2 which can accomplish the decrease in size and frequency and can vibrate in a torsional mode with high efficiency, and a resonator and an electronic device 1 having the resonator element.

Second Embodiment

An electronic device according to a second embodiment of the invention will be described below.

Figure 7:
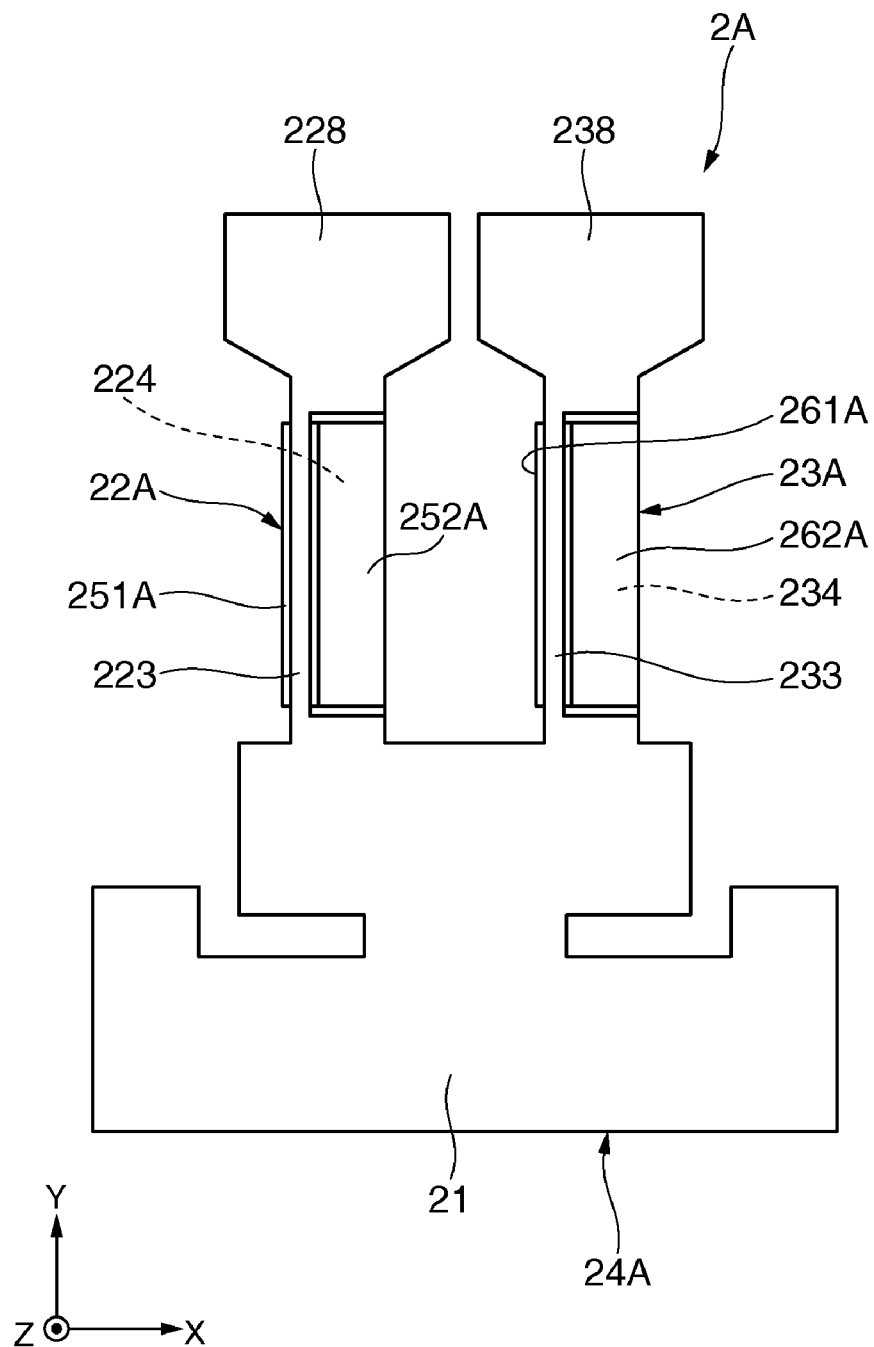
FIG. 7 is a top view of a resonator element included in an electronic device according to a second embodiment of the invention.
Figure 8:
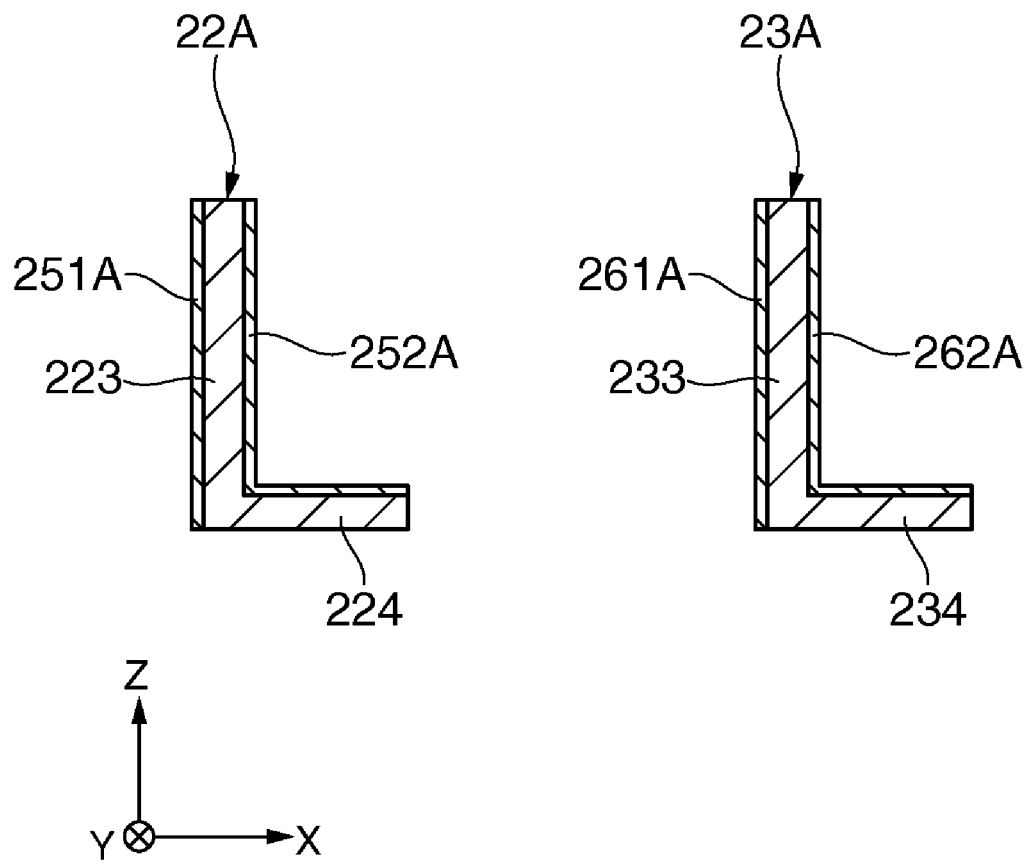
FIG. 8 is a sectional view of the resonator element (a sectional view in the width direction of a resonating arm) shown in FIG. 7.

FIG. 7 is a top view illustrating a resonator element included in an electronic device according to the second embodiment of the invention. FIG. 8 is a sectional view (a sectional view along the width direction of the resonating arm) of the resonator element shown in FIG. 7.

Hereinafter, differences of an electronic device according to the second embodiment from the above-mentioned embodiment will be mainly described and the same configurations will not be described.

The electronic device according to the second embodiment is substantially the same as the first embodiment, except the sectional shape in the width direction of the resonating arm and the arrangement of the excitation electrodes. In FIGS. 7 and 8, the same elements as the above-mentioned embodiment are referenced by the same reference numerals. In FIG. 7, the interconnections and the connection electrodes used to supply power to the excitation electrodes are not shown.

As shown in FIG. 7, the resonator element 2A of the electronic device according to this embodiment includes a piezoelectric member 24A having a base portion 21 and a pair of resonating arms 22A and 23A and excitation electrodes 251A, 252A, 261A, and 262A formed on the piezoelectric member 24A.

As shown in FIG. 8, the sections in the width direction of the pair of resonating arms 22A and 23A each have an L shape.

In the sectional view (XZ section) along the width direction, the resonating arm 22A includes a portion 223 (the first portion) along the Z axis direction and a portion 224 (the second portion) connected to the lower end (one end in the Z axis direction) of the portion 223 in the X axis direction.

Similarly, in the sectional view (XZ section) along the width direction, the resonating arm 23A includes a portion 233 (the first portion) along the Z axis direction and a portion 234 (the second portion) connected to the lower end (one end in the Z axis direction) of the portion 233 in the X axis direction.

The excitation electrode 251A is formed on the surface of the portion 223 of the resonating arm 22A on the opposite side of the portion 224 and the excitation electrode 252A is formed on the surface of the portion 223 facing the portion 224 and the top surface of the portion 224.

Accordingly, when a voltage is applied between the excitation electrode 251A and the excitation electrode 252A, an electric field in the X axis direction is generated in the portion 223 of the resonating arm 22A. By this electric field, the portion 223 stretches or contracts in the Y axis direction.

Similarly, the excitation electrode 261A is formed on the surface of the portion 233 of the resonating arm 23A on the opposite side of the portion 234 and the excitation electrode 262A is formed on the surface of the portion 233 facing the portion 234 and the top surface of the portion 234.

Accordingly, when a voltage is applied between the excitation electrode 261A and the excitation electrode 262A, an electric field in the X axis direction is generated in the portion 233 of the resonating arm 23A. By this electric field, the portion 233 stretches or contracts in the Y axis direction.

On the other hand, the portions 224 and the 234 (the second portion) do not substantially vibrate in the stretch mode in the length direction of the resonating arms 22A and 23A.

The structural portion including the portions 223 and 224 and the structural portion including the portions 233 and 234 cause a rotational moment similarly to the structural portions according to the above-mentioned embodiment. Accordingly, it is possible to cause the resonating arms 22A and 23A to vibrate in the torsional mode.

The structural portion including the portions 223 and 224 is disposed all over the range in the length direction of the resonating arm 22A and the structural portion including the portions 233 and 234 is disposed all over the range in the length direction of the resonating arm 23A. Accordingly, it is possible to relatively simply and efficiently lower the frequency of the torsional vibration of the resonating arms 22A and 23A. The structural portion including the portions 223 and 224 may not be disposed completely all over the range in the length direction of the resonating arm 22A but may be disposed substantially all over the range. The same is true of the structural portion including the portions 233 and 234.

The same advantages as the first embodiment can be obtained from the second embodiment.

Third Embodiment

An electronic device according to a third embodiment of the invention will be described below.

Figure 9:
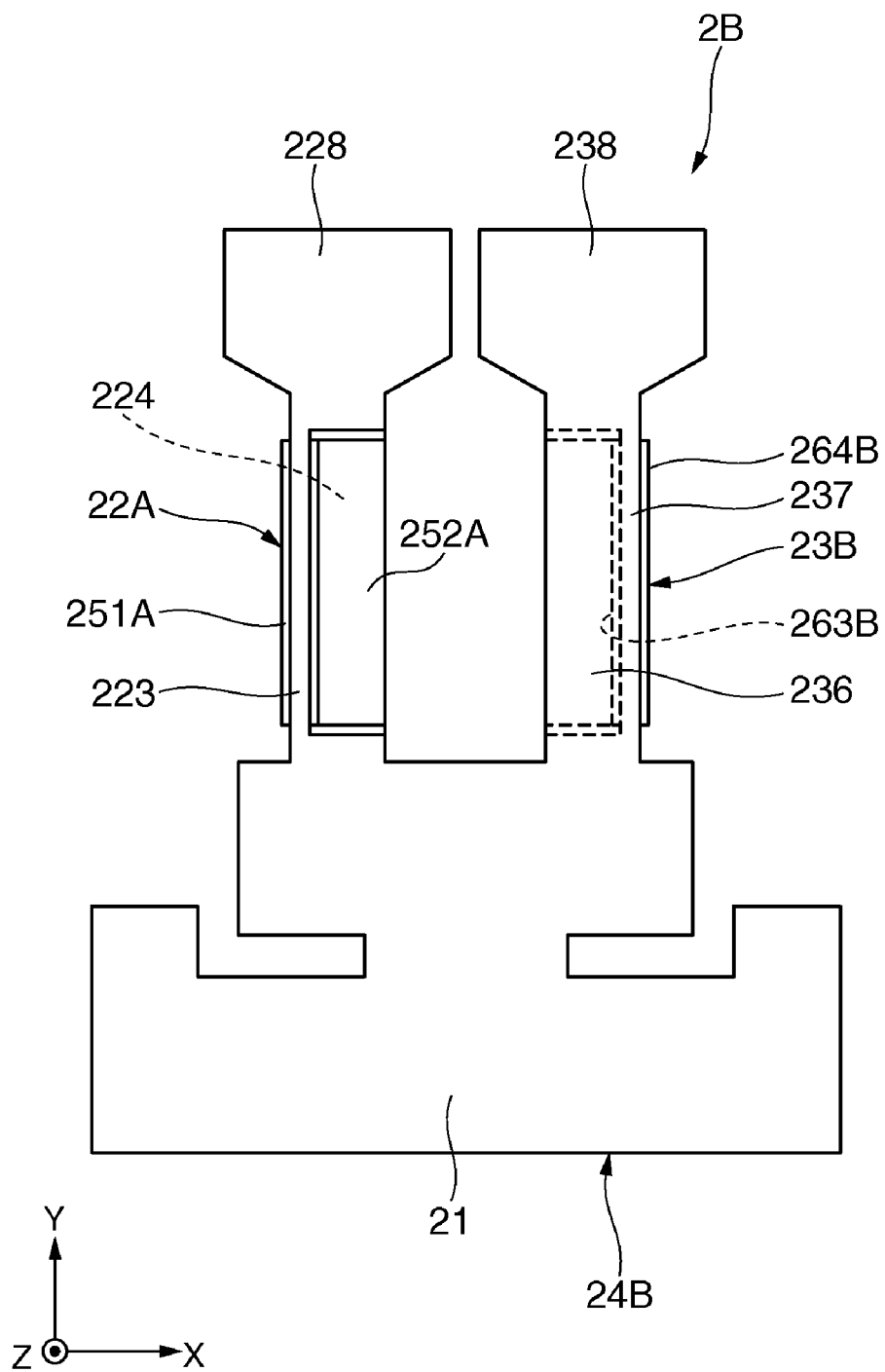
FIG. 9 is a top view of a resonator element included in an electronic device according to a third embodiment of the invention.
Figure 10:
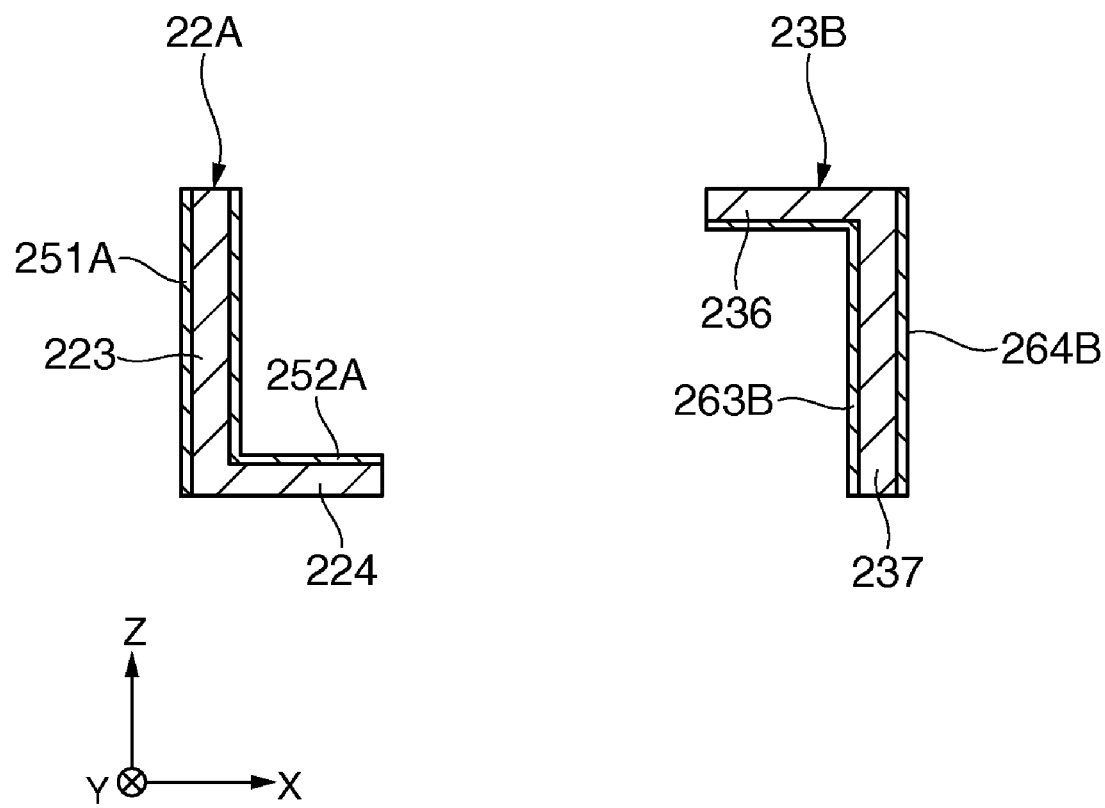
FIG. 10 is a sectional view of the resonator element (a sectional view in the width direction of a resonating arm) shown in FIG. 9.

FIG. 9 is a top view illustrating a resonator element included in an electronic device according to the third embodiment of the invention. FIG. 10 is a sectional view (a sectional view along the width direction of the resonating arm) of the resonator element shown in FIG. 9.

Hereinafter, differences of an electronic device according to the third embodiment from the above-mentioned embodiment will be mainly described and the same configurations will not be described.

The electronic device according to the third embodiment is substantially the same as the first embodiment, except the sectional shape in the width direction of the resonating arm and the arrangement of the excitation electrodes. The electronic device according to the third embodiment is substantially the same as the second embodiment, except the posture in the section along the width direction of one resonating arm of a pair of resonating arms. In FIGS. 9 and 10, the same elements as the above-mentioned embodiment are referenced by the same reference numerals. In FIG. 9, the interconnections and the connection electrodes used to supply power to the excitation electrodes are not shown.

As shown in FIG. 9, the resonator element 2B of the electronic device according to this embodiment includes a piezoelectric member 24B having a base portion 21 and a pair of resonating arms 22A and 23B and excitation electrodes 251A, 252A, 263B, and 264B formed on the piezoelectric member 24B.

As shown in FIG. 10, the section along the width direction of the resonating arm 23B has an L shape and has a posture (bearing) in which the resonating arm 22A has rotated about the center axis by 180°. That is, the resonating arm 22A and the resonating arm 23B are rotationally symmetric about a line therebetween along the Y axis direction.

In the sectional view (XZ section) along the width direction, the resonating arm 23B includes a portion 237 (the first portion) along the Z axis direction and a portion 236 (the second portion) connected to the upper end (one end in the Z axis direction) of the portion 237 in the X axis direction.

The excitation electrode 264B is formed on the surface of the portion 237 of the resonating arm 23B on the opposite side of the portion 236 and the excitation electrode 263B is formed on the surface of the portion 237 facing the portion 236 and the top surface of the portion 236.

Accordingly, when a voltage is applied between the excitation electrode 263B and the excitation electrode 264B, an electric field in the X axis direction is generated in the portion 237 of the resonating arm 23B. By this electric field, the portion 237 stretches or contracts in the Y axis direction.

On the other hand, the portion 236 (the second portion) does not substantially vibrate in the stretch mode in the length direction of the resonating arm 23B.

The structural portion including the portions 236 and 237 causes a rotational moment similarly to the structural portions according to the above-mentioned embodiment. Accordingly, it is possible to cause the resonating arm 23B to vibrate in the torsional mode. Particularly, as described above, the resonating arm 22A and the resonating arm 23B are rotationally symmetric. Accordingly, when the resonating arm 22A and the resonating arm 23B are caused to vibrate in the same phase, it is possible to prevent or suppress the unintentional vibration from being caused.

The same advantages as the first embodiment can be obtained from the third embodiment.

Fourth Embodiment

An electronic device according to a fourth embodiment of the invention will be described below.

Figure 11:
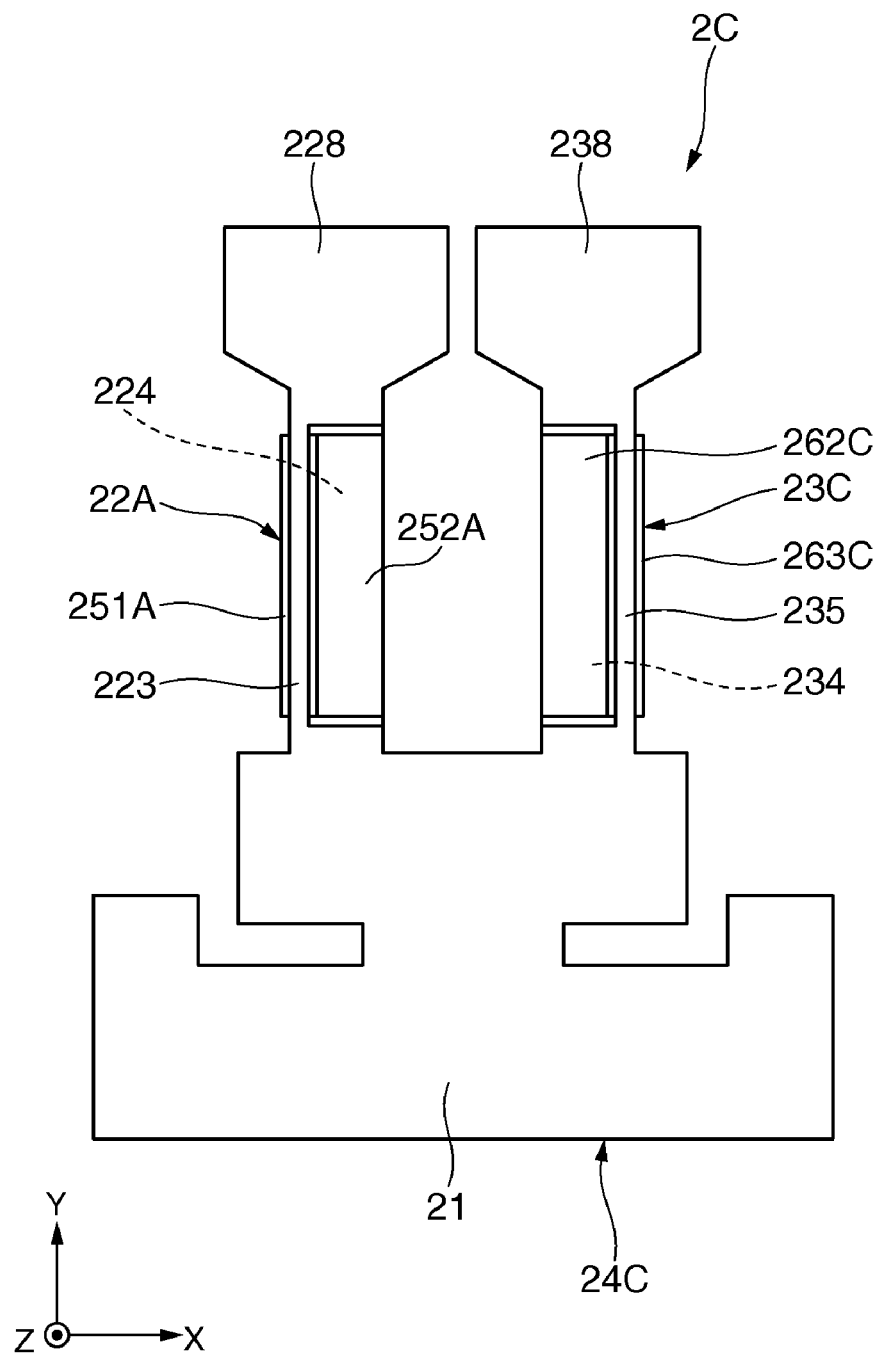
FIG. 11 is a top view of a resonator element included in an electronic device according to a fourth embodiment of the invention.
Figure 12:
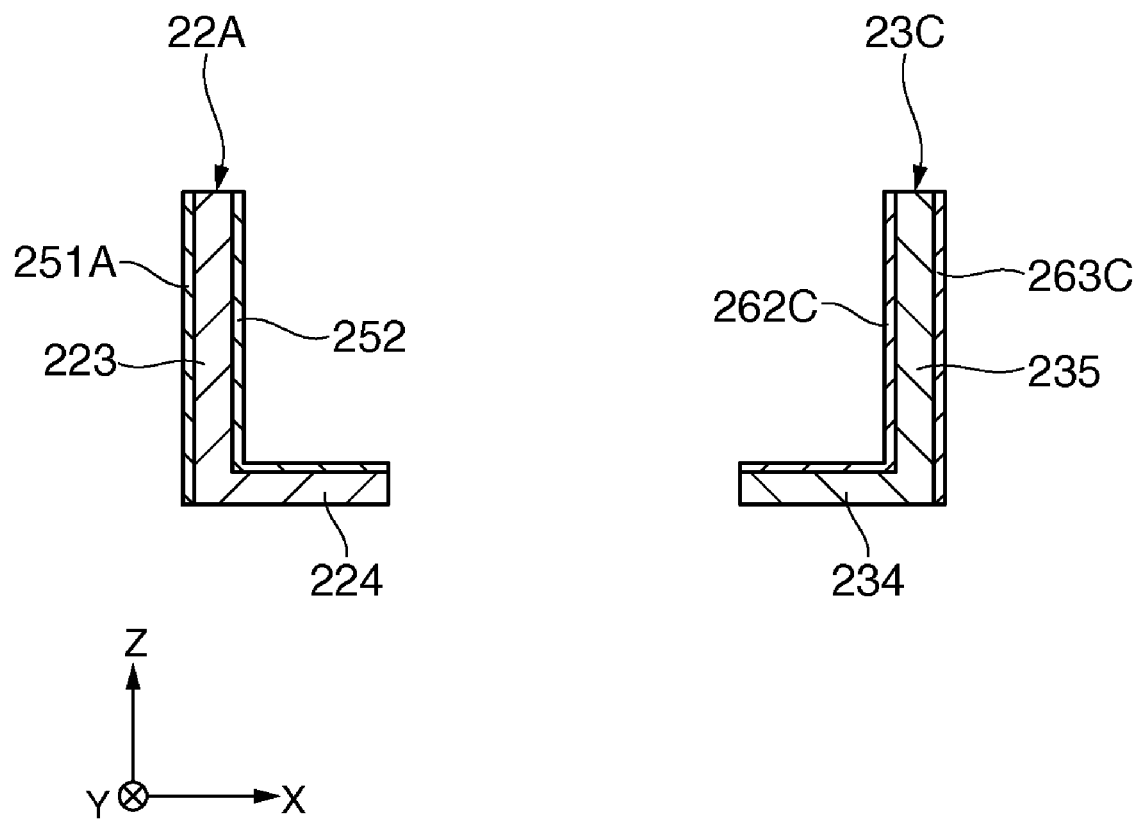
FIG. 12 is a sectional view of the resonator element (a sectional view in the width direction of a resonating arm) shown in FIG. 11.

FIG. 11 is a top view illustrating a resonator element included in an electronic device according to the fourth embodiment of the invention. FIG. 12 is a sectional view (a sectional view along the width direction of the resonating arm) of the resonator element shown in FIG. 11.

Hereinafter, differences of an electronic device according to the fourth embodiment from the above-mentioned embodiment will be mainly described and the same configurations will not be described.

The electronic device according to the fourth embodiment is substantially the same as the first embodiment, except the sectional shape in the width direction of the resonating arm and the arrangement of the excitation electrodes. The electronic device according to the fourth embodiment is substantially the same as the second embodiment, except the posture in the section along the width direction of one resonating arm of a pair of resonating arms. In FIGS. 11 and 12, the same elements as the above-mentioned embodiment are referenced by the same reference numerals. In FIG. 11, the interconnections and the connection electrodes used to supply power to the excitation electrodes are not shown.

As shown in FIG. 11, the resonator element 2C of the electronic device according to this embodiment includes a piezoelectric member 24C having a base portion 21 and a pair of resonating arms 22A and 23C and excitation electrodes 251A, 252A, 262C, and 263C formed on the piezoelectric member 24C.

As shown in FIG. 12, the section along the width direction of the resonating arm 23C has an L shape and the resonating arm 22A and the resonating arm 23C are symmetric about a plane parallel to the Y axis direction and Z axis direction.

In the sectional view (XZ section) along the width direction, the resonating arm 23C includes a portion 235 (the first portion) along the Z axis direction and a portion 236 (the second portion) connected to the lower end (one end in the Z axis direction) of the portion 235 in the X axis direction.

The excitation electrode 263C is formed on the surface of the portion 235 of the resonating arm 23C on the opposite side of the portion 234 and the excitation electrode 262C is formed on the surface of the portion 235 facing the portion 234 and the top surface of the portion 234.

Accordingly, when a voltage is applied between the excitation electrode 262C and the excitation electrode 263C, an electric field in the X axis direction is generated in the portion 235 of the resonating arm 23C. By this electric field, the portion 235 stretches or contracts in the Y axis direction.

On the other hand, the portion 234 (the second portion) does not substantially vibrate in the stretch mode in the length direction of the resonating arm 23C.

The structural portion including the portions 234 and 235 causes a rotational moment similarly to the structural portions according to the above-mentioned embodiment. Accordingly, it is possible to cause the resonating arm 23C to vibrate in the torsional mode. Particularly, as described above, the resonating arm 22A and the resonating arm 23C are plane-symmetric. Accordingly, when the resonating arm 22A and the resonating arm 23C are caused to vibrate in the same phase, it is possible to prevent or suppress the unintentional vibration from being caused.

The same advantages as the first embodiment can be obtained from the fourth embodiment.

Fifth Embodiment

An electronic device according to a fifth embodiment of the invention will be described below.

Figure 13:
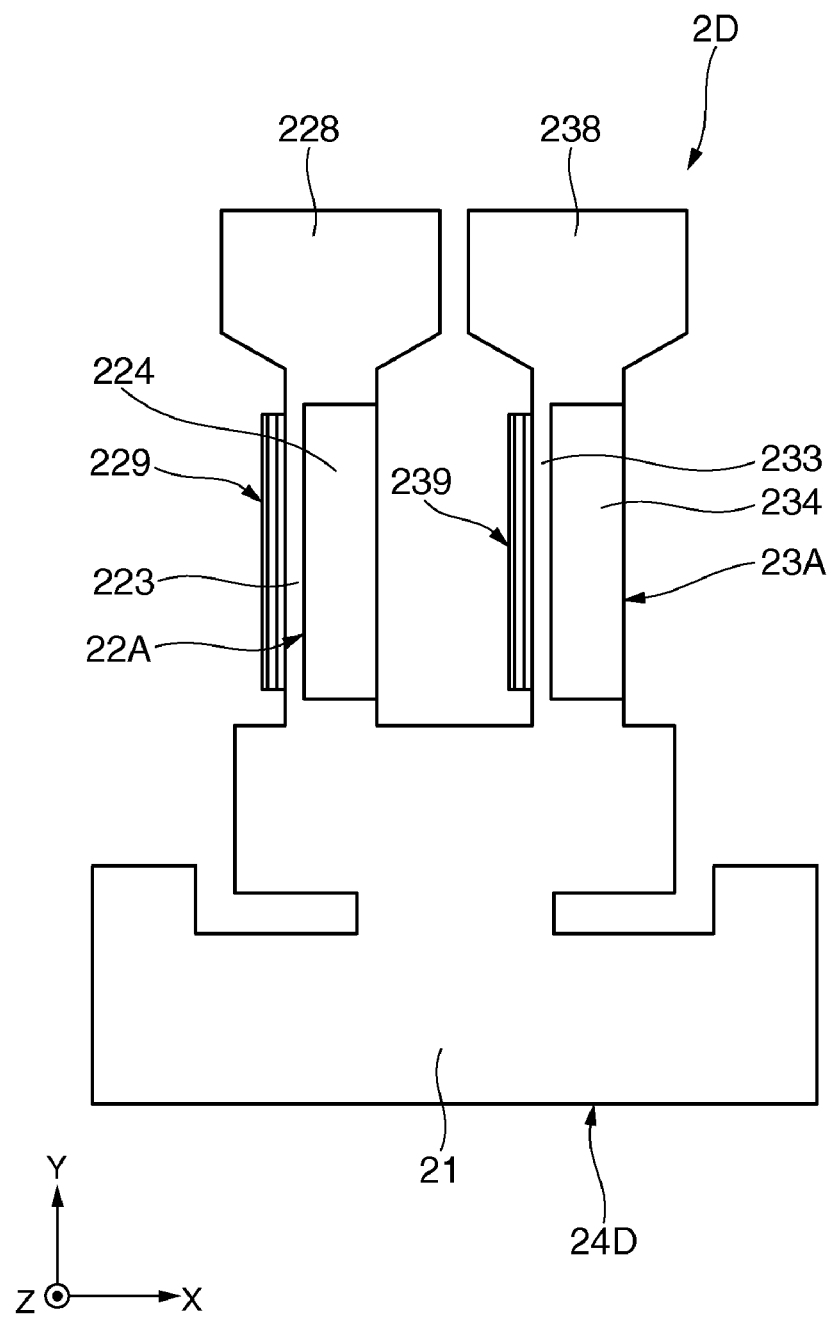
FIG. 13 is a top view of a resonator element included in an electronic device according to a fifth embodiment of the invention.
Figure 14:
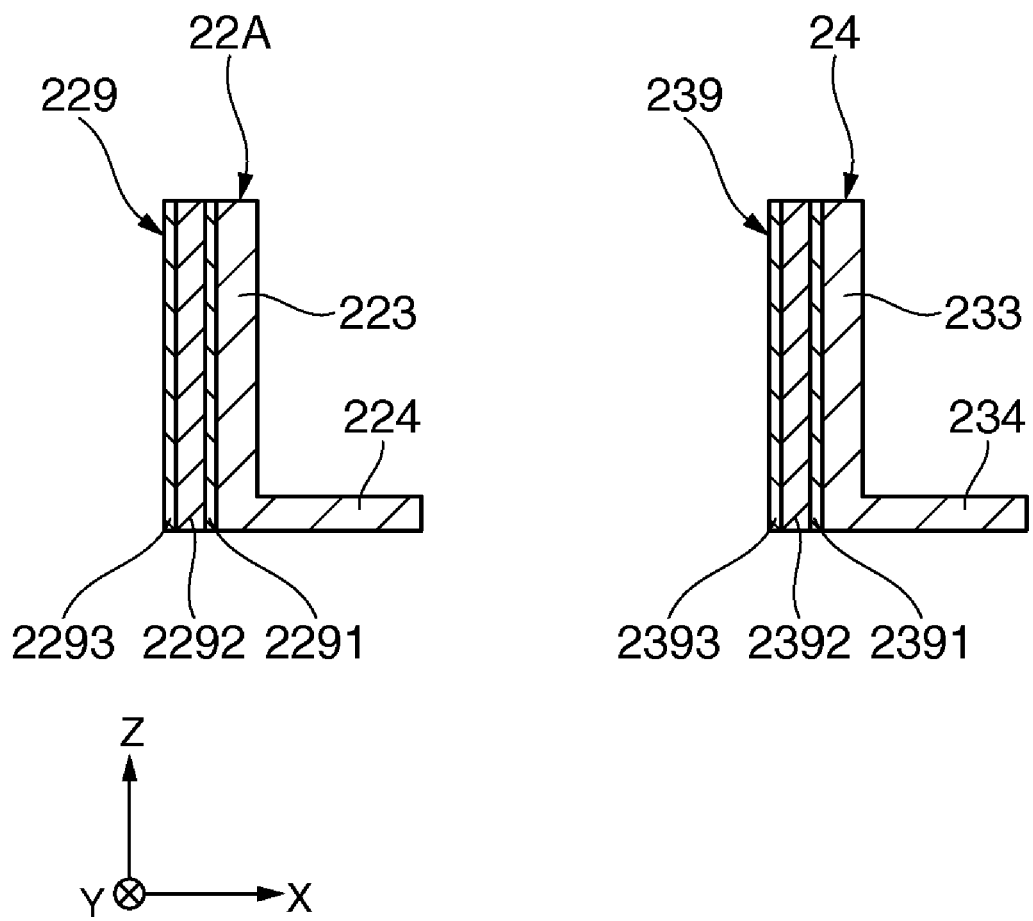
FIG. 14 is a sectional view of the resonator element (a sectional view in the width direction of a resonating arm) shown in FIG. 13.

FIG. 13 is a top view illustrating a resonator element included in an electronic device according to the fifth embodiment of the invention. FIG. 14 is a sectional view (a sectional view along the width direction of the resonating arm) of the resonator element shown in FIG. 13.

Hereinafter, differences of an electronic device according to the fifth embodiment from the above-mentioned embodiment will be mainly described and the same configurations will not be described.

The electronic device according to the fifth embodiment is substantially the same as the first embodiment, except the configurations of the resonating arms and the base portion. The electronic device according to the fifth embodiment is substantially the same as the second embodiment, except that the resonating arms and the base portion are formed of a non-piezoelectric material and a piezoelectric element instead of the driving electrodes is disposed in the resonating arms. In FIGS. 13 and 14, the same elements as the above-mentioned embodiment are referenced by the same reference numerals. In FIG. 13, the interconnections and the connection electrodes used to supply power to the excitation electrodes are not shown.

As shown in FIG. 13, the resonator element 2D of the electronic device according to this embodiment includes a non-piezoelectric member 24D having a base portion 21 and a pair of resonating arms 22A and 23A formed of a non-piezoelectric material and piezoelectric elements 229 and 239 disposed on the non-piezoelectric member 24D.

As shown in FIG. 14, in the sectional view (XZ section) along the width direction, the resonating arm 22A includes a portion 223 (the first portion) along the Z axis direction and a portion 224 (the second portion) connected to the lower end (one end in the Z axis direction) of the portion 223 in the X axis direction.

Similarly, in the sectional view (XZ section) along the width direction, the resonating arm 23A includes a portion 233 (the first portion) along the Z axis direction and a portion 234 (the second portion) connected to the lower end (one end in the Z axis direction) of the portion 233 in the X axis direction.

The piezoelectric element 229 is formed on the surface of the portion 223 of the resonating arm 22A on the opposite side of the portion 224.

As shown in FIG. 14, the piezoelectric element 229 is formed by sequentially stacking an electrode 2291, a piezoelectric layer (piezoelectric film) 2292, and an electrode 2293 on the surface of the portion 223 on the opposite side of the portion 224.

Accordingly, when a voltage is applied between the electrode 2291 and the electrode 2293, an electric field in the X axis direction is generated in the piezoelectric layer 2292. By this electric field, the piezoelectric layer 2292 stretches or contracts in the Y axis direction and the portion 223 stretches or contracts in the Y axis direction therewith.

Similarly, the piezoelectric element 239 is formed on the surface of the portion 233 of the resonating arm 23A on the opposite side of the portion 234.

As shown in FIG. 14, similarly to the piezoelectric element 229, the piezoelectric element 239 is formed by sequentially stacking an electrode 2391, a piezoelectric layer (piezoelectric film) 2392, and an electrode 2393 on the surface of the portion 233 on the opposite side of the portion 234.

Accordingly, when a voltage is applied between the electrode 2391 and the electrode 2393, an electric field in the X axis direction is generated in the piezoelectric layer 2392. By this electric field, the piezoelectric layer 2392 stretches or contracts in the Y axis direction and the portion 233 stretches or contracts in the Y axis direction therewith.

On the other hand, the portions 224 and the 234 (the second portion) do not substantially vibrate in the stretch mode in the length direction of the resonating arms 22A and 23A.

The structural portion including the portions 223 and 224 and the structural portion including the portions 233 and 234 cause a rotational moment similarly to the structural portions according to the above-mentioned embodiment. Accordingly, it is possible to cause the resonating arms 22A and 23A to vibrate in the torsional mode.

Examples of the constituent material (piezoelectric material) of the piezoelectric layers 2292 and 2392 include quartz crystal, lithium tantalate, lithium niobate, lithium borate, and barium titanate.

Particularly, in this embodiment, the resonating arms 22A and 23A are formed of a non-piezoelectric material. Accordingly, when silicon is used as the non-piezoelectric material, it is possible to form the resonating arms 22A and 23A with high size precision by etching, compared with the case where quartz crystal as the piezoelectric material is used. Therefore, it is possible to relatively simply form the vibration reed 2D having a desired vibration characteristic. More specifically, when the resonating arms 22A and 23A are formed of quartz crystal as a piezoelectric material and the outer shapes of the resonating arms 22A and 23A are formed by chemically etching the quartz crystal, fine protrusions having peculiar shapes and heights may be formed on the surfaces of the resonating arms 22A and 23A by the anisotropic etching due to the crystal orientation of the quartz crystal. However, when the resonating arms 22A and 23A are formed of silicon, it is possible to prevent such protrusions from being formed.

The same advantages as the first embodiment can be obtained from the fifth embodiment.

Sixth Embodiment

An electronic device according to a sixth embodiment of the invention will be described below.

Figure 15:
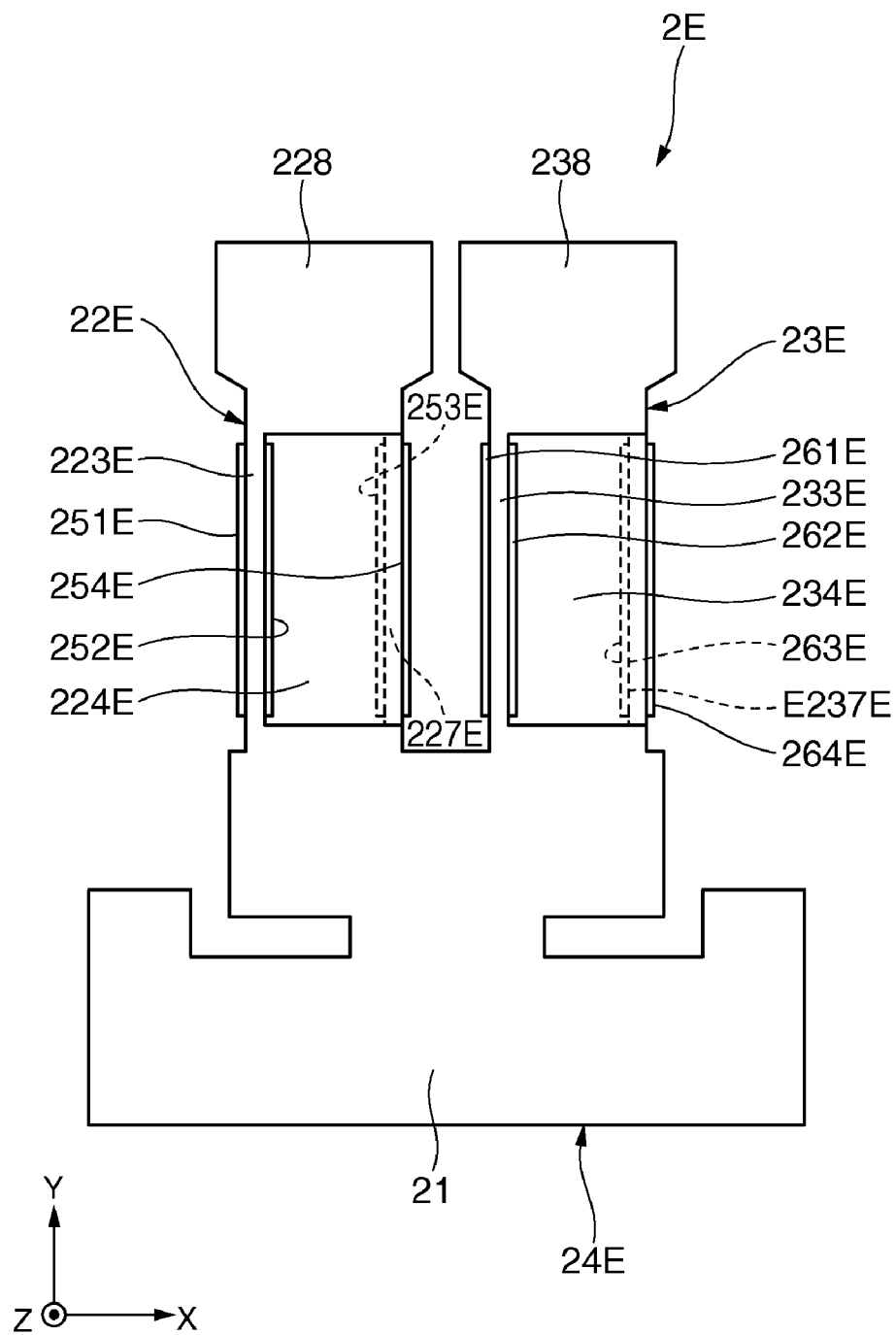
FIG. 15 is a top view of a resonator element included in an electronic device according to a sixth embodiment of the invention.
Figure 16:
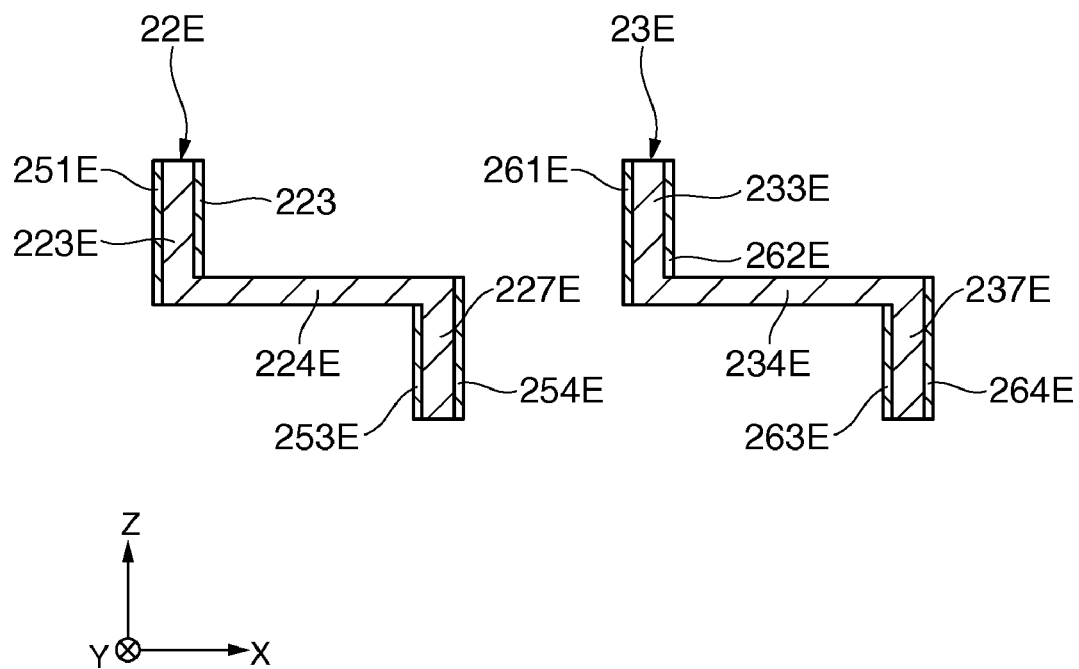
FIG. 16 is a sectional view of the resonator element (a sectional view in the width direction of a resonating arm) shown in FIG. 15.

FIG. 15 is a top view illustrating a resonator element included in an electronic device according to the sixth embodiment of the invention. FIG. 16 is a sectional view (a sectional view along the width direction of the resonating arm) of the resonator element shown in FIG. 15.

Hereinafter, differences of an electronic device according to the sixth embodiment from the above-mentioned embodiment will be mainly described and the same configurations will not be described.

The electronic device according to the sixth embodiment is substantially the same as the first embodiment, except the sectional shape in the width direction of the resonating arm and the arrangement of the excitation electrodes. In FIGS. 15 and 16, the same elements as the above-mentioned embodiment are referenced by the same reference numerals. In FIG. 15, the interconnections and the connection electrodes used to supply power to the excitation electrodes are not shown.

As shown in FIG. 15, the resonator element 2E of the electronic device according to this embodiment includes a piezoelectric member 24E having a base portion 21 and a pair of resonating arms 22E and 23E and excitation electrodes 251E, 252E, 253E, 254E, 261E, 262E, 263E, and 264E formed on the piezoelectric member 24E.

As shown in FIG. 16, the sections in the width direction of the pair of resonating arms 22E and 23E each have a shape formed by combining two L shapes so as to be rotationally symmetric about the center axis along the Y axis direction.

In the sectional view (XZ section) along the width direction, the resonating arm 22E includes portions 223E and 227E (the first portion) along the Z axis direction and a portion 224E (the second portion) connecting the lower end of the portion 223E to the upper end of the portion 227E in the X axis direction.

Similarly, in the sectional view (XZ section) along the width direction, the resonating arm 23E includes portions 233E and 237E (the first portion) along the Z axis direction and a portion 234E (the second portion) connecting the lower end of the portion 233E to the upper end of the portion 237E in the X axis direction.

The excitation electrode 251E is formed on the surface of the portion 223E of the resonating arm 22E on the opposite side of the portion 224E, the excitation electrode 252E is formed on the surface of the portion 223E facing the portion 224E, the excitation electrode 254E is formed on the surface of the portion 227E on the opposite side of the portion 224E, and the excitation electrode 253E is formed on the surface of the portion 227E on the opposite side of the portion 224E.

Accordingly, when a voltage is applied between the excitation electrode 251E and the excitation electrode 252E, an electric field in the X axis direction is generated in the portion 223E of the resonating arm 22E. By this electric field, the portion 223E stretches or contracts in the Y axis direction. When a voltage is applied between the excitation electrode 253E and the excitation electrode 254E, an electric field in the X axis direction is generated in the portion 227E of the resonating arm 22E. By this electric field, the portion 227E stretches or contracts in the Y axis direction in the same phase as the portion 223E.

Similarly, the excitation electrode 261E is formed on the surface of the portion 233E of the resonating arm 23E on the opposite side of the portion 234E, the excitation electrode 262E is formed on the surface of the portion 233E facing the portion 234E, the excitation electrode 264E is formed on the surface of the portion 237E on the opposite side of the portion 234E, and the excitation electrode 263E is formed on the surface of the portion 237E on the opposite side of the portion 234E.

Accordingly, when a voltage is applied between the excitation electrode 261E and the excitation electrode 262E, an electric field in the X axis direction is generated in the portion 233E of the resonating arm 23E. By this electric field, the portion 233E stretches or contracts in the Y axis direction. When a voltage is applied between the excitation electrode 263E and the excitation electrode 264E, an electric field in the X axis direction is generated in the portion 237E of the resonating arm 23E. By this electric field, the portion 237E stretches or contracts in the Y axis direction in the same phase as the portion 233E.

On the other hand, the portions 224E and the 234E (the second portion) do not substantially vibrate in the stretch mode in the length direction of the resonating arms 22E and 23E.

The structural portion including the portions 223E and 224E and the structural portion including the portions 233E and 234E cause a rotational moment similarly to the structural portions according to the above-mentioned embodiment. Accordingly, it is possible to cause the resonating arms 22A and 23A to vibrate in the torsional mode.

The same advantages as the first embodiment can be obtained from the sixth embodiment.

Seventh Embodiment

An electronic device according to a seventh embodiment of the invention will be described below.

Figure 17:
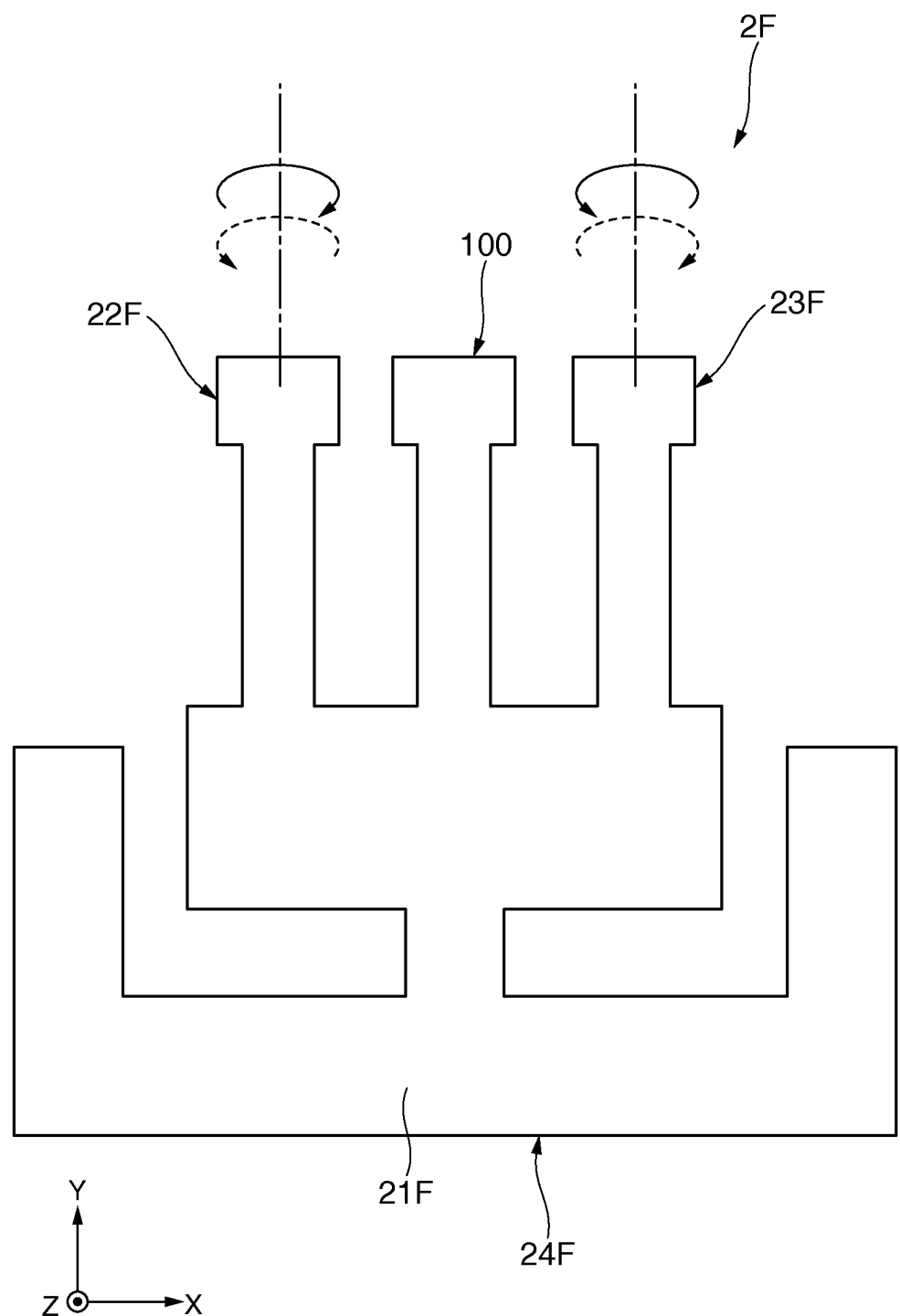
FIG. 17 is a top view of a resonator element included in an electronic device according to a seventh embodiment of the invention.

FIG. 17 is a top view illustrating a resonator element included in an electronic device according to the seventh embodiment of the invention.

Hereinafter, differences of an electronic device according to the seventh embodiment from the above-mentioned embodiment will be mainly described and the same configurations will not be described.

The electronic device according to the seventh embodiment is substantially the same as the first embodiment, except that a flexing resonating arm is provided in addition to a pair of torsional resonating arms and the torsional resonating arms of the pair are set to inverse phases. In FIG. 17, the interconnections and the connection electrodes used to supply power to the excitation electrodes are not shown.

As shown in FIG. 17, the resonator element 2F of the electronic device according to this embodiment includes a piezoelectric member 24F. The piezoelectric member 24F includes a base portion 21F, a pair of resonating arms 22F and 23F vibrating in the torsional mode and a resonating arm 100 vibrating in a flexing mode.

The pair of vibrations arms 22F and 23F is disposed to extend from the base portion 21F in parallel to each other.

The pair of resonating arms 22F and 23F vibrates in the stretch mode so as to stretch or contract in the opposite directions (in the inverse phase).

The resonating arms 22F and 23F can be formed in the same way as the resonating arms in the above-mentioned embodiments.

The resonating arm 100 is disposed to extend from the base portion 21F between the pair of resonating arms 22F and 23F in parallel thereto.

The resonating arm 100 vibrates in the flexing mode in the Z axis direction. Particularly, in this embodiment, the pair of resonating arms 22F and 23F vibrates in the stretch mode in the opposite directions as described above. Accordingly, the portion of the base 21F close to the base end portion of the resonating arm 100 vibrates in the thickness direction (the Z axis direction) with the stretch vibration, but the resonating arm 100 vibrates in the flexing mode so as to cancel the vibration of the base portion 21F. Therefore, it is possible to reduce the vibration leakage of the resonator element 2F.

A known resonating arm vibrating in the flexing mode can be used as the resonating arm 100. The excitation electrodes can be formed depending on the material and shape of the resonating arm 100 so as to cause the above-mentioned flexing vibration.

The same advantages as the first embodiment can be obtained from the seventh embodiment.

Eighth Embodiment

An electronic device according to an eighth embodiment of the invention will be described below.

Figure 18:
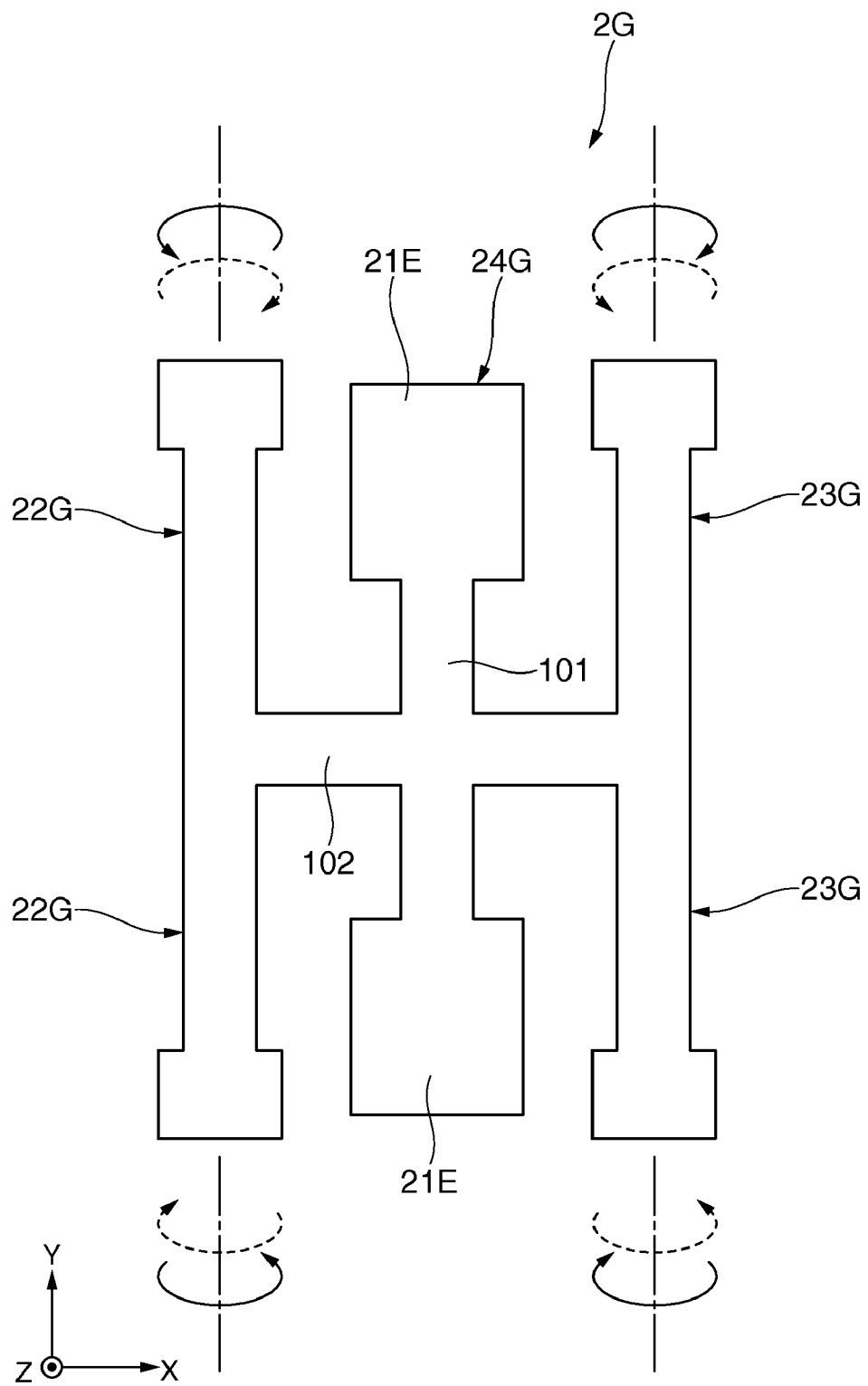
FIG. 18 is a top view of a resonator element included in an electronic device according to an eighth embodiment of the invention.

FIG. 18 is a top view illustrating a resonator element included in an electronic device according to the eighth embodiment of the invention.

Hereinafter, differences of an electronic device according to the eighth embodiment from the above-mentioned embodiment will be mainly described and the same configurations will not be described.

The electronic device according to the eighth embodiment is substantially the same as the first embodiment, except that two pairs of torsional resonating arms are provided and the torsional resonating arms of the pairs parallel to each other are set to inverse phases. In FIG. 18, the interconnections and the connection electrodes used to supply power to the excitation electrodes are not shown.

As shown in FIG. 18, the resonator element 2G of the electronic device according to this embodiment includes a piezoelectric member 24G. The piezoelectric member 24G includes a pair of base portions 21E, connection portions 101 and 102, and two pairs of resonating arms 22G and 23G vibrating in the torsional mode.

The pair of base portions 21E is fixed to a support substrate (base substrate) and is provided with a rectangular connection portion 101 so as to connect the pair of base portions 21G.

A rectangular connection portion 102 extending in the opposite directions of the X axis direction is connected to the middle way (middle portion) in the length direction of the connection portion 101.

The pair of resonating arms 22G is connected to one end of the connection portion 102 so as to extend in the opposite directions of the Y axis direction. The pair of resonating arms 23G is connected to the other end of the connection portion 102 so as to extend in the opposite directions of the Y axis direction.

Accordingly, two pairs of resonating arms 22G and 23G parallel to each other are provided. The resonating arms 22G of a pair are disposed along the same line. Similarly, the resonating arms 23G of a pair are disposed along the same line.

The pair of resonating arms 22G and 23G parallel to each other vibrates in the stretch mode so as to stretch and contract in the opposite directions (in the inverse phases).

The resonating arms 22G of the pair disposed along the same line vibrate in the torsional mode in the same direction (in the opposite directions as viewed in the same direction). Similarly, the resonating arms 23G of the pair disposed along the same line vibrate in the torsional mode in the same direction (in the opposite directions as viewed in the same direction).

The resonating arms 22G and 23G can be formed in the same way as the resonating arms in the above-mentioned embodiments.

When the pairs of resonating arms 22G and 23G parallel to each other vibrate in the torsional mode, the vibration reed 2G causes such flexing vibration to get close to or separated from each other (in the X axis direction).

In this embodiment, the vibration by one pair of resonating arms 22G and 23G parallel to each other and the vibration by the other pair of resonating arms 22G and 23G are generated to cancel each other. Accordingly, it is possible to reduce the vibration leakage from the vibration reed 2G.

The same advantages as the first embodiment can be obtained from the eighth embodiment.

The electronic devices according to the above-mentioned embodiments can be applied to various electronic apparatuses. The resultant electronic apparatuses have high reliability.

The electronic apparatus employing the electronic device according to the invention is not particularly limited. Examples thereof include a personal computer (a mobile personal computer), a mobile phone, a digital still camera, an ink jet ejection apparatus (for example, an ink jet printer), a laptop personal computer, a television, a video camera, a video tape recorder, a car navigation apparatus, a pager, an electronic pocketbook (also including a communication unit), an electronic dictionary, a calculator, an electronic game machine, a word processor, a work station, a television phone, a security television monitor, an electronic binocular telescope, a POS terminal, medical instruments (such as electronic thermometer, a blood-pressure meter, a blood-glucose meter, an electrocardiogram meter, an ultrasonic diagnosis device, and an electronic endoscope), a fishfinder, various measuring apparatuses, meters (such as meters of vehicles, aircrafts, and ships), and a flight simulator.

Figure 19:
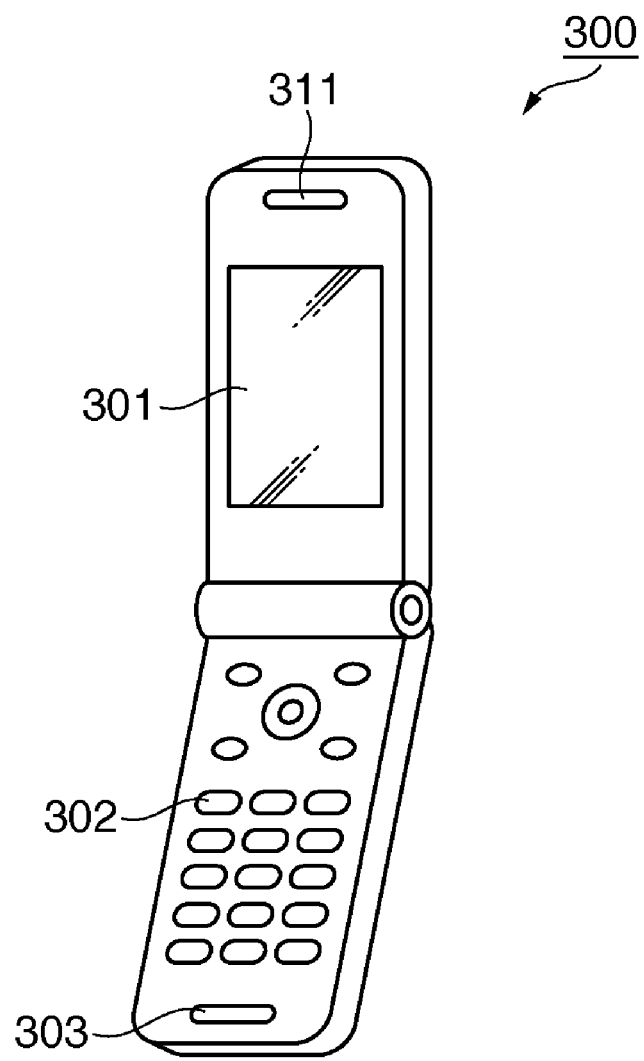
FIG. 19 is a perspective view schematically illustrating a mobile phone as an example of an electronic apparatus according to the invention.
Figure 20:
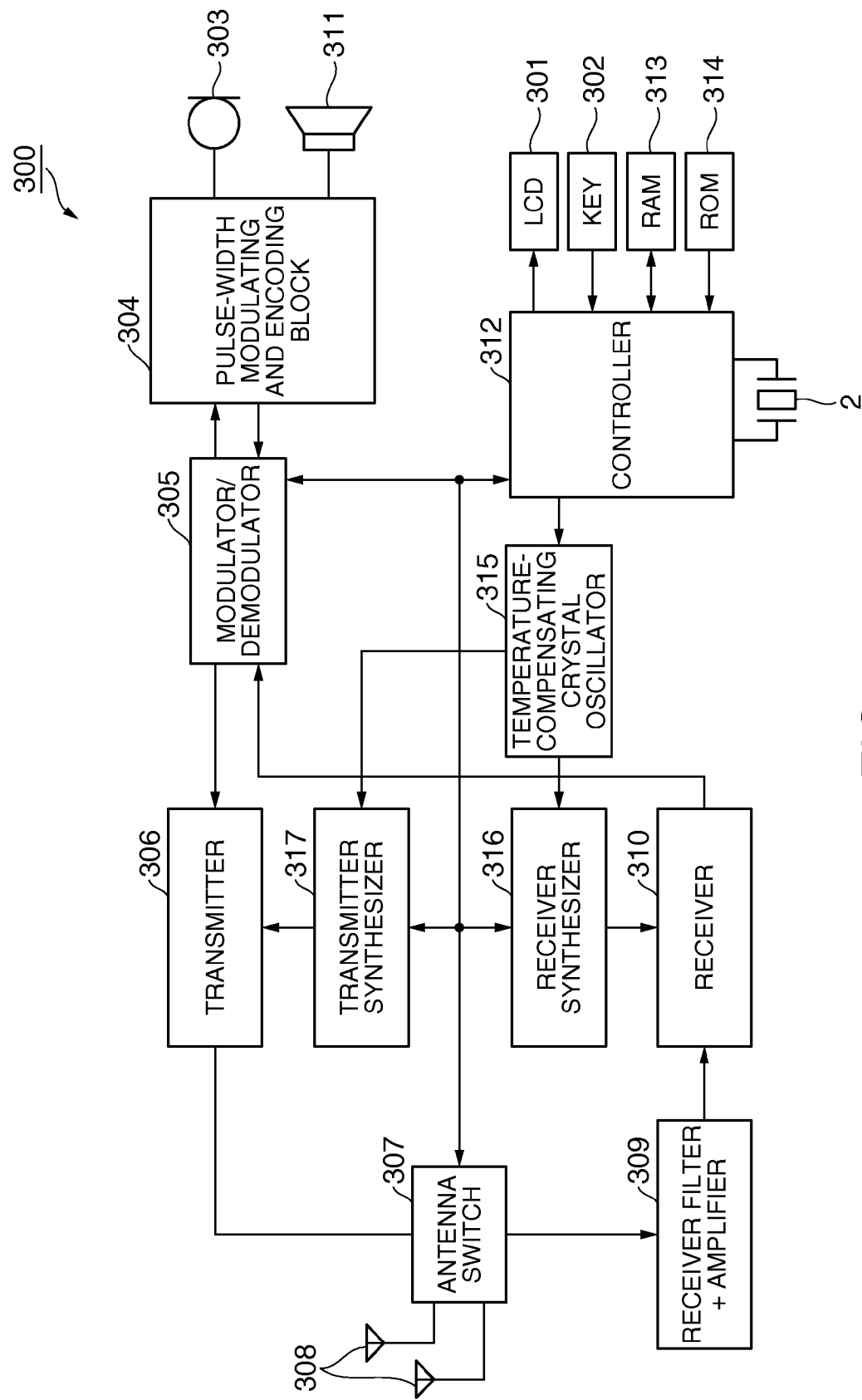
FIG. 20 is a circuit block diagram illustrating the mobile phone as an example of an electronic apparatus according to the invention.

FIGS. 19 and 20 show a mobile phone as an example of the electronic apparatus according to the invention. FIG. 19 is a perspective view schematically illustrating the appearance of the mobile phone. FIG. 20 is a circuit block diagram illustrating the circuit unit of the mobile phone.

The mobile phone 300 can employ the above-mentioned resonator elements 2 and 2A to 2G. In this example, it is assumed that the resonator element 2 is used. The elements and operations of the resonator element 2 are referenced by like reference numerals and will not be described.

As shown in FIG. 19, the mobile phone 300 includes an LCD (Liquid Crystal Display) 301 as a display unit, keys 302 as an input unit for numerals, a micro phone 303, a speaker 311, and a circuit unit not shown.

As shown in FIG. 20, when a user inputs his or her voice to the micro phone 303 for transmission from the mobile phone 300, a signal is transmitted from an antenna 308 via a pulse-width modulating and encoding block 304, a modulator/demodulator block 305, a transmitter 306, and an antenna switch 307.

On the other hand, a signal transmitted from another phone is received by the antenna 308 and is input to the modulator/demodulator block 305 from a receiver 310 via the antenna switch 307 and a receiver filter 309. The modulated or demodulated signal is output as sound from the speaker 311 via the pulse-width modulating and encoding block 304.

A controller 312 controlling the antenna switch 307, the modulator/demodulator block 305, and the like is provided. The controller 312 includes a driving circuit (not shown) electrically connected to the resonator element 2.

The controller 312 controls the LDC 301 as the display unit, the keys 302 as the input unit of numerals, a RAM 313, and a ROM 314 in addition to the above-mentioned elements and thus requires high precision. There is a need for the decrease in size of the mobile phone 300.

The above-mentioned resonator element 2 is used to meet such requirements.

The mobile phone 300 further includes a temperature-compensating crystal oscillator 315, a receiver synthesizer 316, and a transmitter synthesizer 317 as other constituent blocks, which are not described.

Although the resonator element, the resonator, the electronic device, and the electronic apparatus according to the embodiments of the invention have been described with the drawings, the invention is not limited to the embodiments and the configurations of the drawings can be replaced with other configurations having the same functions. Other elements may be added to the invention. The invention may be embodied by combining two or more configurations (features) of the embodiments.

Although it has been described in the above-mentioned embodiments that one resonating arm one or two or four structural portions having the first portion and the second portion, the number of structural portions is not limited to those and may be three or five or more. When the resonating arm includes plural structural portions, the arrangement of the structural portions is not particularly limited as long as it can cause the resonating arm to vibrate in a torsional mode as a whole.

Although it has been described in the above-mentioned embodiments that the excitation electrodes (structural portions) are disposed at the distal end and the base end in the length direction of the resonating arm and that the excitation electrodes (structural portions) are disposed all over the range in the length direction of the resonating arm, the excitation electrodes (structural portions) may be disposed in only one of the base end and the distal end of the resonating arm or may be disposed substantially at the center of the resonating arm.

Although it has been described in the above-mentioned embodiment that the resonator element includes one to four resonating arms, the invention is not limited to this configuration and the number of resonating arms may be five or more.

Although it has been described in the above-mentioned embodiments that the second portions does not substantially stretch or contract with the application of a voltage to the first portion, the second portion may vibrate in a stretch mode with a phase different from that of the first portion with the application of a voltage to the first portion. The electronic device according to the invention may be applied to a gyro sensor in addition to piezoelectric oscillators such as a simple packaged crystal oscillator (SPXO), a voltage-controlled crystal oscillator (VCXO), a temperature-compensating crystal oscillator (TCXO), and an oven-controlled crystal oscillator (OCXO).

The entire disclosure of Japanese Patent Application No. 2010-059955, filed Mar. 16, 2010 is expressly incorporated by reference herein.

What is claimed is:

1. A resonator element comprising at least one resonating arm that vibrates in a torsional mode,
   wherein the resonating arm includes a structural portion having a first portion disposed in a first direction in a sectional view in the width direction and a second portion connected to the first portion so that the center of gravity departs from the center of gravity of the first portion in the first direction and a second direction perpendicular to the first direction,
   wherein the first portion vibrates in a stretch mode in the length direction of the resonating arm with an application of a voltage, and
   wherein the second portion does not substantially vibrate in the stretch mode in the length direction of the resonating arm with the application of the voltage or vibrates in a stretch mode with a phase different from that of the first portion.

2. The resonator element according to claim 1, wherein the first portion and the second portion each have a long plate shape in the length direction of the resonating arm and ends thereof in the width direction are connected to each other so that plate surfaces thereof are perpendicular to each other.

3. The resonator element according to claim 2, wherein the resonating arm includes a plurality of the structural portions.

4. The resonator element according to claim 3, wherein the resonating arm includes the plurality of structural portions so as to be arranged in the length direction.

5. The resonator element according to claim 3, wherein the resonating arm includes a pair of the structural portions so as to face each other with the center axis along the length direction interposed therebetween.

6. The resonator element according to claim 2, wherein the resonating arm includes the structural portion which is formed to extend all over the range in the length direction.

7. The resonator element according to claim 2, wherein the resonating arm is formed to be symmetric about the center axis along the length direction.

8. The resonator element according to claim 1, wherein the distal end of the resonating arm is provided with a massive portion of which the sectional area in the sectional view along the width direction of the resonating arm is greater than that of the structural portion.

9. The resonator element according to claim 1, wherein a plurality of the resonating arms are provided.

10. The resonator element according to claim 9, wherein a pair of the resonating arms vibrating in a torsional mode in the same direction are provided to be parallel to each other.

11. The resonator element according to claim 1, wherein the resonating arm is formed of a piezoelectric material.

12. The resonator element according to claim 1, wherein the resonating arm is formed of a non-piezoelectric material and a piezoelectric element having a piezoelectric thin film is disposed on the first portion of the resonating arm.

13. A resonator comprising:
   the resonator element according to claim 1; and
   a package that receives the resonator element therein.

14. An electronic device comprising:
   the resonator element according to claim 1; and
   an electronic component that drives the resonator element.

15. An electronic apparatus comprising:
   the resonator element according to claim 1; and
   an electronic component that drives the resonator element.

* * * * *